(12) United States Patent
Shokrollahi et al.

(10) Patent No.: US 10,467,177 B2
(45) Date of Patent: Nov. 5, 2019

(54) HIGH SPEED MEMORY INTERFACE

(71) Applicant: Kandou Labs, S.A., Lausanne (CH)

(72) Inventors: Amin Shokrollahi, Préverenges (CH);
Brian Holden, Monte Sereno, CA (US);
David Stauffer, Essex Junction, VT (US)

(73) Assignee: KANDOU LABS, S.A., Lausanne (CH)

( * ) Notice: Subject to any disclaimer, the term of this patent is extended or adjusted under 35 U.S.C. 154(b) by 103 days.

(21) Appl. No.: 15/835,591

(22) Filed: Dec. 8, 2017

(65) Prior Publication Data

US 2019/0179791 A1    Jun. 13, 2019

(51) Int. Cl.
| | |
|---|---|
| *G06F 12/00* | (2006.01) |
| *G06F 13/42* | (2006.01) |
| *G06F 11/10* | (2006.01) |
| *G11C 5/06* | (2006.01) |
| *G06F 13/16* | (2006.01) |
| *G06T 1/60* | (2006.01) |
| *G06F 1/08* | (2006.01) |
| *G06F 1/06* | (2006.01) |

(52) U.S. Cl.
CPC ...... *G06F 13/4243* (2013.01); *G06F 11/1004* (2013.01); *G06F 13/1689* (2013.01); *G11C 5/06* (2013.01); *G06F 1/06* (2013.01); *G06F 1/08* (2013.01); *G06F 13/161* (2013.01); *G06F 13/1673* (2013.01); *G06T 1/60* (2013.01)

(58) Field of Classification Search
CPC ...... G06T 1/60; G06F 11/1004; G06F 13/161; G06F 13/1673; G06F 13/1689; G06F 1/06; G06F 1/08; G06F 13/4243; G11C 5/06

USPC ........................................................ 711/167
See application file for complete search history.

(56) References Cited

U.S. PATENT DOCUMENTS

| | | | |
|---|---|---|---|
| 3,196,351 | A | 7/1965 | David |
| 3,970,795 | A | 7/1976 | Allen |
| 4,163,258 | A | 7/1979 | Ebihara et al. |
| 4,499,550 | A | 2/1985 | Ray et al. |
| 4,722,084 | A | 1/1988 | Morton |
| 4,974,211 | A | 11/1990 | Corl |
| 5,053,974 | A | 10/1991 | Penz |

(Continued)

FOREIGN PATENT DOCUMENTS

| | | |
|---|---|---|
| CN | 1864346 A | 11/2006 |
| CN | 101276645 A | 10/2008 |

(Continued)

OTHER PUBLICATIONS

Abbasfar, Aliazam, "Generalized Differential Vector Signaling", IEEE International Conference on Communications, ICC '09, Jun. 14, 2009, 1-5 (5 pages).

(Continued)

*Primary Examiner* — Mardochee Chery
(74) *Attorney, Agent, or Firm* — Invention Mine LLC

(57) ABSTRACT

Systems and methods for an Enhanced High Bandwidth Memory (EHBM) are described, utilizing fewer physical wires than a HBM interface with each wire operating at a much higher signaling rate. The same logical signals and commands of HBM are supported over this higher-speed transport, with the resulting lower wire count and reduced signal density allowing use of lower-cost interconnection such as an organic rather than a silicon interposer between GPU and DRAM stack.

20 Claims, 25 Drawing Sheets

(56) References Cited

U.S. PATENT DOCUMENTS

| | | |
|---|---|---|
| 5,166,956 A | 11/1992 | Baltus et al. |
| 5,283,761 A | 2/1994 | Gillingham |
| 5,287,305 A | 2/1994 | Yoshida |
| 5,311,516 A | 5/1994 | Kuznicki et al. |
| 5,331,320 A | 7/1994 | Cideciyan et al. |
| 5,412,689 A | 5/1995 | Chan et al. |
| 5,449,895 A | 9/1995 | Hecht et al. |
| 5,553,097 A | 9/1996 | Dagher |
| 5,689,509 A | 11/1997 | Gaytan et al. |
| 5,856,935 A | 1/1999 | Moy et al. |
| 5,889,981 A | 3/1999 | Betker et al. |
| 5,949,060 A | 9/1999 | Schattschneider et al. |
| 5,982,954 A | 11/1999 | Delen et al. |
| 5,995,016 A | 11/1999 | Perino |
| 6,005,895 A | 12/1999 | Perino et al. |
| 6,084,883 A | 7/2000 | Norrell et al. |
| 6,084,958 A | 7/2000 | Blossom |
| 6,097,732 A | 8/2000 | Jung |
| 6,154,498 A | 11/2000 | Dabral et al. |
| 6,226,330 B1 | 5/2001 | Mansur |
| 6,242,321 B1 | 6/2001 | Acosta et al. |
| 6,278,740 B1 | 8/2001 | Nordyke |
| 6,317,465 B1 | 11/2001 | Akamatsu et al. |
| 6,359,931 B1 | 3/2002 | Perino et al. |
| 6,378,073 B1 | 4/2002 | Davis et al. |
| 6,404,820 B1 | 6/2002 | Postol |
| 6,452,420 B1 | 9/2002 | Wong |
| 6,483,828 B1 | 11/2002 | Balachandran et al. |
| 6,504,875 B2 | 1/2003 | Perino et al. |
| 6,556,628 B1 | 4/2003 | Poulton et al. |
| 6,621,427 B2 | 9/2003 | Greenstreet |
| 6,621,945 B2 | 9/2003 | Bissessur |
| 6,650,638 B1 | 11/2003 | Walker et al. |
| 6,661,355 B2 | 12/2003 | Cornelius et al. |
| 6,766,342 B2 | 7/2004 | Kechriotis |
| 6,865,236 B1 | 3/2005 | Terry |
| 6,876,317 B2 | 4/2005 | Sankaran |
| 6,898,724 B2 | 5/2005 | Chang |
| 6,954,492 B1 | 10/2005 | Williams |
| 6,976,194 B2 | 12/2005 | Cypher |
| 6,982,954 B2 | 1/2006 | Dhong et al. |
| 6,990,138 B2 | 1/2006 | Bejjani et al. |
| 6,999,516 B1 | 2/2006 | Rajan |
| 7,023,817 B2 | 4/2006 | Kuffner et al. |
| 7,038,486 B2 | 5/2006 | Aoyama et al. |
| 7,039,136 B2 | 5/2006 | Olson et al. |
| 7,075,996 B2 | 7/2006 | Simon et al. |
| 7,085,153 B2 | 8/2006 | Ferrant et al. |
| 7,127,003 B2 | 10/2006 | Rajan et al. |
| 7,142,612 B2 | 11/2006 | Horowitz et al. |
| 7,180,949 B2 | 2/2007 | Kleveland et al. |
| 7,184,483 B2 | 2/2007 | Rajan |
| 7,269,212 B1 | 9/2007 | Chau et al. |
| 7,356,213 B1 | 4/2008 | Cunningham et al. |
| 7,358,869 B1 | 4/2008 | Chiarulli et al. |
| 7,389,333 B2 | 6/2008 | Moore et al. |
| 7,633,850 B2 | 12/2009 | Ahn |
| 7,656,321 B2 | 2/2010 | Wang |
| 7,706,456 B2 | 4/2010 | Laroia et al. |
| 7,746,764 B2 | 6/2010 | Rawlins et al. |
| 7,808,456 B2 | 10/2010 | Chen et al. |
| 7,808,830 B2 | 10/2010 | Kasuta |
| 7,868,790 B2 | 1/2011 | Bae |
| 7,869,546 B2 | 1/2011 | Tsai |
| 7,899,653 B2 | 3/2011 | Hollis |
| 8,050,332 B2 | 11/2011 | Chung et al. |
| 8,055,095 B2 | 11/2011 | Palotai et al. |
| 8,149,906 B2 | 4/2012 | Saito et al. |
| 8,159,375 B2 | 4/2012 | Abbasfar |
| 8,159,376 B2 | 4/2012 | Abbasfar |
| 8,180,931 B2 | 5/2012 | Lee et al. |
| 8,199,849 B2 | 6/2012 | Oh et al. |
| 8,199,863 B2 | 6/2012 | Chen et al. |
| 8,218,670 B2 | 7/2012 | Abou |
| 8,245,094 B2 | 8/2012 | Jiang et al. |
| 8,279,745 B2 | 10/2012 | Dent |
| 8,279,976 B2 | 10/2012 | Lin et al. |
| 8,284,848 B2 | 10/2012 | Nam et al. |
| 8,289,914 B2 | 10/2012 | Li et al. |
| 8,295,250 B2 | 10/2012 | Gorokhov et al. |
| 8,359,445 B2 | 1/2013 | Perego et al. |
| 8,365,035 B2 | 1/2013 | Hara |
| 8,406,315 B2 | 3/2013 | Tsai |
| 8,437,440 B1 | 5/2013 | Zhang et al. |
| 8,472,513 B2 | 6/2013 | Malipatil et al. |
| 8,498,368 B1 | 7/2013 | Husted et al. |
| 8,520,493 B2 | 8/2013 | Goulahsen |
| 8,539,318 B2 | 9/2013 | Shokrollahi et al. |
| 8,577,284 B2 | 11/2013 | Seo et al. |
| 8,578,246 B2 | 11/2013 | Mittelholzer et al. |
| 8,588,254 B2 | 11/2013 | Diab et al. |
| 8,588,280 B2 | 11/2013 | Oh et al. |
| 8,593,305 B1 | 11/2013 | Tajalli et al. |
| 8,620,166 B2 | 12/2013 | Guha |
| 8,644,497 B2 | 2/2014 | Clausen et al. |
| 8,649,445 B2 | 2/2014 | Cronie et al. |
| 8,687,968 B2 | 4/2014 | Nosaka et al. |
| 8,718,184 B1 | 5/2014 | Cronie et al. |
| 8,755,426 B1 | 6/2014 | Cronie et al. |
| 8,773,964 B2 | 7/2014 | Hsueh et al. |
| 8,780,687 B2 | 7/2014 | Clausen et al. |
| 8,831,440 B2 | 9/2014 | Yu et al. |
| 8,879,660 B1 | 11/2014 | Peng et al. |
| 8,897,134 B2 | 11/2014 | Kern et al. |
| 8,938,171 B2 | 1/2015 | Tang et al. |
| 8,949,693 B2 | 2/2015 | Ordentlich et al. |
| 8,989,317 B1 | 3/2015 | Holden et al. |
| 8,996,740 B2 | 3/2015 | Wiley et al. |
| 9,015,566 B2 | 4/2015 | Dronie et al. |
| 9,071,476 B2 | 6/2015 | Fox et al. |
| 9,077,386 B1 | 7/2015 | Holden et al. |
| 9,100,232 B1 | 8/2015 | Hormati et al. |
| 9,197,470 B2 | 11/2015 | Okunev |
| 9,246,713 B2 | 1/2016 | Shokrollahi |
| 9,251,873 B1 | 2/2016 | Fox et al. |
| 9,288,082 B1 | 3/2016 | Ulrich et al. |
| 9,288,089 B2 | 3/2016 | Cronie et al. |
| 9,331,962 B2 | 5/2016 | Lida et al. |
| 9,362,974 B2 | 6/2016 | Fox et al. |
| 9,363,114 B2 | 6/2016 | Shokrollahi et al. |
| 9,401,828 B2 | 7/2016 | Cronie et al. |
| 9,432,082 B2 | 8/2016 | Ulrich et al. |
| 9,432,298 B1 | 8/2016 | Smith |
| 9,461,862 B2 | 10/2016 | Holden et al. |
| 9,479,369 B1 | 10/2016 | Shokrollahi |
| 9,509,437 B2 | 11/2016 | Shokrollahi |
| 9,537,644 B2 | 1/2017 | Jones et al. |
| 9,634,797 B2 | 4/2017 | Benammar et al. |
| 9,667,379 B2 | 5/2017 | Cronie et al. |
| 9,710,412 B2 | 7/2017 | Sengoku |
| 10,055,372 B2 | 8/2018 | Shokrollani |
| 2001/0006538 A1 | 7/2001 | Simon et al. |
| 2002/0044316 A1 | 4/2002 | Myers |
| 2002/0057592 A1 | 5/2002 | Robb |
| 2002/0152340 A1 | 10/2002 | Dreps et al. |
| 2002/0154633 A1 | 10/2002 | Shin et al. |
| 2002/0174373 A1 | 11/2002 | Chang |
| 2002/0181607 A1 | 12/2002 | Izumi |
| 2003/0086366 A1 | 5/2003 | Branlund et al. |
| 2004/0057525 A1 | 3/2004 | Rajan et al. |
| 2004/0146117 A1 | 7/2004 | Subramaniam et al. |
| 2004/0155802 A1 | 8/2004 | Lamy et al. |
| 2004/0161019 A1 | 8/2004 | Raghavan et al. |
| 2004/0239374 A1 | 12/2004 | Hori |
| 2005/0027876 A1 | 2/2005 | Umei et al. |
| 2005/0174841 A1 | 8/2005 | Ho |
| 2005/0213686 A1 | 9/2005 | Love et al. |
| 2006/0013331 A1 | 1/2006 | Choi et al. |
| 2006/0126751 A1 | 6/2006 | Bessios |
| 2006/0159005 A1 | 7/2006 | Rawlins et al. |
| 2006/0236174 A1 | 10/2006 | Whetsel |
| 2006/0291589 A1 | 12/2006 | Eliezer et al. |
| 2007/0030796 A1 | 2/2007 | Green |
| 2008/0104374 A1 | 5/2008 | Mohamed |

(56) References Cited

U.S. PATENT DOCUMENTS

| | | |
|---|---|---|
| 2008/0192621 A1 | 8/2008 | Suehiro |
| 2008/0316070 A1 | 12/2008 | Van et al. |
| 2009/0046009 A1 | 2/2009 | Fujii |
| 2009/0059782 A1 | 3/2009 | Cole |
| 2009/0154604 A1 | 6/2009 | Lee et al. |
| 2010/0046644 A1 | 2/2010 | Mazet |
| 2010/0054355 A1 | 3/2010 | Kinjo et al. |
| 2010/0081451 A1 | 4/2010 | Mueck et al. |
| 2010/0122021 A1 | 5/2010 | Lee et al. |
| 2010/0215112 A1 | 8/2010 | Tsai et al. |
| 2010/0235673 A1 | 9/2010 | Abbasfar |
| 2010/0296556 A1 | 11/2010 | Rave et al. |
| 2010/0309964 A1 | 12/2010 | Oh et al. |
| 2011/0014865 A1 | 1/2011 | Seo et al. |
| 2011/0072244 A1 | 3/2011 | Lindholm et al. |
| 2011/0235501 A1 | 9/2011 | Goulahsen |
| 2011/0268225 A1 | 11/2011 | Cronie et al. |
| 2011/0286497 A1 | 11/2011 | Nervig |
| 2011/0299555 A1 | 12/2011 | Cronie et al. |
| 2011/0302478 A1 | 12/2011 | Cronie et al. |
| 2011/0317559 A1 | 12/2011 | Kern et al. |
| 2012/0213299 A1 | 8/2012 | Cronie et al. |
| 2012/0243589 A1 | 9/2012 | Desjardins |
| 2013/0010892 A1 | 1/2013 | Cronie et al. |
| 2013/0013870 A1 | 1/2013 | Cronie et al. |
| 2013/0114392 A1 | 5/2013 | Sun et al. |
| 2013/0188656 A1 | 7/2013 | Ferraiolo et al. |
| 2013/0259113 A1 | 10/2013 | Kumar |
| 2013/0346830 A1 | 12/2013 | Ordentlich et al. |
| 2014/0177645 A1 | 6/2014 | Cronie et al. |
| 2014/0254642 A1 | 9/2014 | Fox et al. |
| 2014/0269130 A1 | 9/2014 | Maeng et al. |
| 2015/0078479 A1 | 3/2015 | Whitby-Strevens |
| 2015/0222458 A1 | 8/2015 | Hormati et al. |
| 2015/0236885 A1 | 8/2015 | Ling et al. |
| 2015/0249559 A1 | 9/2015 | Shokrollahi et al. |
| 2015/0333940 A1 | 11/2015 | Shokrollahi |
| 2015/0349835 A1 | 12/2015 | Fox et al. |
| 2015/0365263 A1* | 12/2015 | Zhang .................. H04L 1/0057 375/295 |
| 2015/0380087 A1 | 12/2015 | Mittelholzer et al. |
| 2015/0381768 A1 | 12/2015 | Fox et al. |
| 2016/0020824 A1 | 1/2016 | Ulrich et al. |
| 2016/0036616 A1 | 2/2016 | Holden et al. |
| 2016/0218894 A1 | 7/2016 | Fox et al. |
| 2016/0380787 A1 | 12/2016 | Hormati et al. |
| 2017/0272285 A1 | 9/2017 | Shokrollahi et al. |
| 2018/0299921 A1* | 10/2018 | Rajwani .............. G06F 9/30141 |
| 2018/0307971 A1* | 10/2018 | Sinha ..................... G06F 15/78 |
| 2019/0103903 A1 | 4/2019 | Yang |

FOREIGN PATENT DOCUMENTS

| | | |
|---|---|---|
| CN | 101854223 A | 10/2010 |
| CN | 101999116 A | 3/2011 |
| CN | 102254571 B | 6/2015 |
| JP | 2003163612 A | 6/2003 |
| WO | 2009084121 A1 | 7/2009 |
| WO | 2010031824 A1 | 3/2010 |
| WO | 2011153000 A2 | 12/2011 |

OTHER PUBLICATIONS

Anonymous , "Constant-weight code", Wikipedia.org, retrieved on Feb. 6, 2017, (3 pages).

Counts, Lew , et al., "One-Chip "Slide Rule" Works with Logs, Antilogs for Real-Time Processing", Analog Devices, Computational Products 6, Reprinted from Electronic Design, May 2, 1985, 3-9 (7 pages).

Dasilva, Victor , et al., "Multicarrier Orthogonal CDMA Signals for Quasi-Synchronous Communication Systems", IEEE Journal on Selected Areas in Communications, vol. 12, No. 5, Jun. 1994, 842-852 (11 pages).

Elmhurst, Daniel , et al., "A 1.8 128-Mb 125-MHz Multi-level Cell Flash Memory With Flexible Read While Write", IEEE Journal of Solid-State Circuits, vol. 38, No. 11, Nov. 2003, 1929-1933 (5 pages).

Farzan, Kamran , et al., "Coding Schemes for Chip-to-Chip Interconnect Applications", IEEE Transactions on Very Large Scale Integration (VLSI) Systems, vol. 14, No. 4, Apr. 2006, 393-406 (14 pages).

Giovaneli, Carlos Lopez, et al., "Space-Frequency Coded OFDM System for Multi-Wire Power Line Communications", Power Line Communications and Its Applications, 2005 International Symposium on Vancouver, BC, Canada, IEEE XP-002433844, Apr. 6-8, 2005, 191-195 (5 pages).

Healey, Adam , et al., "A Comparison of 25 Gbps NRZ & PAM-4 Modulation used in Legacy & Premium Backplane Channels", Tyco Electronics Corporation, DesignCon 2012, Jan. 2012, 1-16 (16 pages).

Holden, Brian , "An exploration of the technical feasibility of the major technology options for 400GE backplanes", IEEE 802.3 400GE Study Group, Geneva, CH, Jul. 16, 2013, 1-18 (18 pages).

Holden, Brian , "Simulation results for NRZ, ENRZ & PAM-4 on 16-wire full-sized 400GE backplanes", IEEE 802.3 400GE Study Group, York, UK, Sep. 2, 2013, 1-19 (19 pages).

Holden, Brian , "Using Ensemble NRZ Coding for 400GE Electrical Interfaces", IEEE 802.3 400GE Study Group, May 17, 2013, 1-24 (24 pages).

Jiang, Anxiao , et al., "Rank Modulation for Flash Memories", IEEE Transactions of Information Theory, vol. 55, No. 6, Jun. 2009, 2659-2673 (16 pages).

Oh, Dan , et al., "Pseudo-Differential Vector Signaling for Noise Reduction in Single-Ended Signaling Systems", DesignCon 2009, Rambus Inc., Jan. 2009, (22 pages).

Poulton, John , "Multiwire Differential Signaling", UNC-CH Department of Computer Science Version 1.1, Aug. 5, 2003, 1-20 (20 pages).

She, James , et al., "A Framework of Cross-Layer Superposition Coded Multicast for Robust IPTV Services over WiMAX", IEEE Wireless Communications and Networking Conference, Apr. 15, 2008, 3139-3144 (6 pages).

Skliar, Osvaldo , et al., "A Method for the Analysis of Signals: the Square-Wave Method", Revista de Matematica: Teoria y Aplicationes, vol. 15, No. 2, Mar. 2008, 109-129 (21 pages).

Slepian, David , "Permutation Modulation", Proceedings of the IEE, vol. 53, No. 3, Mar. 1965, 228-236 (9 pages).

Wang, Xin , et al., "Applying CDMA Technique to Network-on-Chip", IEEE Transactions on Very Large Scale Integration (VLSI) Systems, vol. 15, No. 10, Oct. 1, 2007, 1091-1100 (10 pages).

* cited by examiner

Table I - Training Pattern

| Bit / Frame | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|
| 0 | FEC(3) | SF | CKE | RFU | F(7) | FEC(3) | SF | 1 | 0 | F(7) | FEC(3) | SF | 1 | 0 | F(7) | FEC(3) | SF | 1 | 0 | F(7) | FEC(3) | SF | 1 | 1 | F(7) |
| 1 | FEC(2) | 1 | 0 | 1 | F(6) | FEC(2) | 1 | 0 | 1 | F(6) | FEC(2) | 1 | 0 | 1 | F(6) | FEC(2) | 1 | 0 | 1 | C(5) | FEC(2) | 1 | 0 | 0 | F(6) |
| 2 | FEC(1) | 0 | 1 | 0 | F(5) | FEC(1) | 0 | 1 | 0 | F(5) | FEC(1) | 0 | 1 | 0 | F(5) | FEC(1) | 0 | 1 | 0 | F(5) | FEC(1) | 0 | 1 | 1 | F(5) |
| 3 | FEC(0) | 0 | 1 | 1 | F(4) | FEC(0) | 0 | 1 | 1 | F(4) | FEC(0) | 0 | 1 | 1 | F(4) | FEC(0) | 0 | 1 | 1 | F(4) | FEC(0) | 0 | 1 | 0 | F(4) |
| 4 | 1 | 1 | 0 | 1 | F(3) | 1 | 1 | 0 | 1 | F(3) | 1 | 1 | 0 | 1 | F(3) | 1 | 1 | 0 | 1 | F(3) | 1 | 1 | 0 | 1 | F(3) |
| 5 | 0 | 0 | 0 | 1 | F(2) | 0 | 0 | 0 | 1 | F(2) | 0 | 0 | 0 | 1 | F(2) | 0 | 0 | 0 | 1 | F(2) | 0 | 0 | 0 | 1 | F(2) |
| 6 | 1 | CST(1) | CST(0) | 0 | F(1) | 1 | 1 | 0 | 1 | F(1) | 1 | 1 | 0 | 1 | F(1) | 1 | 1 | 0 | 1 | F(1) | 1 | 1 | 0 | 1 | F(1) |
| 7 | 0 | 1 | 0 | 1 | F(0) | 0 | 0 | 0 | 0 | F(0) | 0 | 0 | 0 | 0 | F(0) | 0 | 0 | 0 | 0 | F(0) | 0 | 0 | 0 | 0 | F(0) |

Table II - Host-to-Memory Multiplexing

| Bit / Frame | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|
| 0 | FEC(3) | SF | CKE | AEXT(5:4) | FEC(15) | | | D(127:124) | | FEC(11) | | | D(95:92) | | FEC(7) | | | D(63:60) | | FEC(3) | | | D(31:28) | |
| 1 | FEC(2) | AEXT(3:0) | | | FEC(14) | | | D(123:120) | | FEC(10) | | | D(91:88) | | FEC(6) | | | D(59:56) | | FEC(2) | | | D(27:24) | |
| 2 | FEC(1) | EN(1:0) | | C(7:6) | | FEC(13) | | | D(119:116) | | FEC(9) | | | D(87:84) | | FEC(5) | | | D(55:52) | | FEC(1) | | | D(23:20) | |
| 3 | FEC(0) | | C(4:1) | | | FEC(12) | | | D(115:112) | | FEC(8) | | | D(83:80) | | FEC(4) | | | D(51:48) | | FEC(0) | | | D(19:16) | |
| 4 | C(0) | R(5:2) | | | DM(15) | | | D(111:108) | | DM(11) | | | D(79:76) | | DM(7) | | | D(47:44) | | DM(3) | | | D(15:12) | |
| 5 | R(1:0) | | PAR(3:1) | | DM(14) | | | D(107:104) | | DM(10) | | | D(75:72) | | DM(6) | | | D(43:40) | | DM(2) | | | D(11:8) | |
| 6 | PAR(0) | CST(1:0) | | C(5) | RFU | DM(13) | | | D(103:100) | | DM(9) | | | D(71:68) | | DM(5) | | | D(39:36) | | DM(1) | | | D(7:4) |
| 7 | RFU | | DBIPAR(3:0) | | | DM(12) | | | D(99:96) | | DM(8) | | | D(67:64) | | DM(4) | | | D(35:32) | | DM(0) | | | D(3:0) |

Table III - Memory-to-Host Multiplexing

| Bit / Frame | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|
| 0 | FEC(3) | SF | RFU | AEXT(5:4) | FEC(15) | | | D(127:124) | | FEC(11) | | | D(95:92) | | FEC(7) | | | D(63:60) | | FEC(3) | | | D(31:28) | |
| 1 | FEC(2) | AEXT(3:0) | | | FEC(14) | | | D(123:120) | | FEC(10) | | | D(91:88) | | FEC(6) | | | D(59:56) | | FEC(2) | | | D(27:24) | |
| 2 | FEC(1) | RFU | EN | DERR(3:2) | | FEC(13) | | | D(119:116) | | FEC(9) | | | D(87:84) | | FEC(5) | | | D(55:52) | | FEC(1) | | | D(23:20) | |
| 3 | FEC(0) | DERR(1:0) | AERR | RFU | | FEC(12) | | | D(115:112) | | FEC(8) | | | D(83:80) | | FEC(4) | | | D(51:48) | | FEC(0) | | | D(19:16) | |
| 4 | | RFU | | | DM(15) | | | D(111:108) | | DM(11) | | | D(79:76) | | DM(7) | | | D(47:44) | | DM(3) | | | D(15:12) | |
| 5 | RFU | | PAR(3:1) | | DM(14) | | | D(107:104) | | DM(10) | | | D(75:72) | | DM(6) | | | D(43:40) | | DM(2) | | | D(11:8) | |
| 6 | PAR(0) | CST(1:0) | | RFU | | DM(13) | | | D(103:100) | | DM(9) | | | D(71:68) | | DM(5) | | | D(39:36) | | DM(1) | | | D(7:4) |
| 7 | RFU | | DBIPAR(3:0) | | | DM(12) | | | D(99:96) | | DM(8) | | | D(67:64) | | DM(4) | | | D(35:32) | | DM(0) | | | D(3:0) |

FIG. 11

HIGH SPEED MEMORY INTERFACE

REFERENCES

The following references are herein incorporated by reference in their entirety for all purposes:

U.S. Patent Publication No. 2011/0268225 of U.S. patent application Ser. No. 12/784,414, filed May 20, 2010, naming Harm Cronie and Amin Shokrollahi, entitled "Orthogonal Differential Vector Signaling", hereinafter identified as [Cronie I];

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes", hereinafter identified as [Cronie II];

U.S. patent application Ser. No. 14/158,452, filed Jan. 17, 2014, naming John Fox, Brian Holden, Peter Hunt, John D Keay, Amin Shokrollahi, Richard Simpson, Anant Singh, Andrew Kevin John Stewart, and Giuseppe Surace, entitled "Chip-to-Chip Communication with Reduced SSO Noise", hereinafter identified as [Fox I];

U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. Pat. No. 9,100,232, filed Feb. 2, 2015, naming Ali Hormati and Amin Shokrollahi, entitled "Method and Apparatus for Low Power Chip-to-Chip Communications with Constrained ISI Ratio", hereinafter identified as [Hormati I];

U.S. Provisional Patent Application No. 61/934,807, filed Feb. 2, 2014, naming Amin Shokrollahi, entitled "Vector Signaling Codes with High pin-efficiency and their Application to Chip-to-Chip Communications and Storage", hereinafter identified as [Shokrollahi I];

U.S. Provisional Patent Application No. 61/839,360, filed Jun. 23, 2013, naming Amin Shokrollahi, entitled "Vector Signaling Codes with Reduced Receiver Complexity", hereinafter identified as [Shokrollahi II].

U.S. Provisional Patent Application No. 61/946,574, filed Feb. 28, 2014, naming Amin Shokrollahi, Brian Holden, and Richard Simpson, entitled "Clock Embedded Vector Signaling Codes", hereinafter identified as [Shokrollahi III].

U.S. Provisional Patent Application No. 62/015,172, filed Jul. 10, 2014, naming Amin Shokrollahi and Roger Ulrich, entitled "Vector Signaling Codes with Increased Signal to Noise Characteristics", hereinafter identified as [Shokrollahi IV].

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich I].

The following references are cited in this application using the labels set out in brackets:

A 1.2V 8 Gb 8-Channel 128 GB/s High Bandwidth Memory (HBM) Stacked DRAM with Effective Microbump I/O Test Methods Using 29 nm Process and TSV, Dong Uk Lee, Kyung Whan Kim, Young Jun Park, Jae Hwan Kim, Dae Suk Kim, Heat Bin Park, Jin Wook Shin, Jang Hwan Cho, Ki Hun Kwon, Min Jeong Kim, Jaejin Lee, Kun Woo Park, Byongtae Chung, and Sungjoo Hong, 2014 IEEE International Solid-State Circuits Conference, hereinafter identified as [Lee et al].

JEDEC Standard, High Bandwidth Memory (HBM) DRAM, JESD235, JEDEC Solid State Technology Association, 2015, hereinafter identified as [JEDEC HBM].

TECHNICAL FIELD

The present embodiments relate to communications in general and in particular to the transmission of signals capable of conveying information and detection of those signals in wired communication.

BACKGROUND

The High Bandwidth Memory HBM interface was introduced in 2014 as a means of providing extremely high bandwidth and low latency interconnection of multiple Dynamic RAM (DRAM) Memory devices to a high performance processing device, such as a Graphics Processing Unit (GPU). The packaging interface specification for these memory devices was standardized as [JEDEC HBM].

As described in [Lee et al], the DRAM devices in a HBM interconnection are vertically stacked using Through-Silicon Via (TSV) connections to bring signals to a base silicon device or "base chip", which then interconnects to the GPU device using high-density planar interconnection such as provided by a silicon interposer. Typically, there are four DRAM devices in a stack. The base chip may provide support for manufacturing test and other auxiliary functions, as well as providing physical routing of signals between the high density TSV stack connection to the DRAMS and the lower density ball array or other interconnection to the interposer.

A HBM interface supports eight independent 128-wire data transfer channels, and the full 8 channel HBM interface includes a minimum of 1701 signal wires, including 5 global signals. This sets a minimum for the base chip to GPU wiring required to support the HBM interconnection. (The actual number of TSV connections within the DRAM stack is significantly greater, as it also includes several hundred power supply and mechanical interconnections.) Although achievable using technologies such as a silicon interposer, providing this density and quantity of interconnection wires between planar chip devices is expensive. Moreover, this number of connections to a controller device such as a GPU uses significant I/O pad "beachfront" on the controller die, creating a scalability barrier to future system requirements for two or more HBM connections to provide greater memory bandwidth or larger total memory size.

BRIEF DESCRIPTION

An Enhanced High Bandwidth Memory (EHBM) interface is described, utilizing fewer physical wires than a HBM interface with each wire operating at a much higher signaling rate. The same logical signals and commands of HBM are supported over this higher-speed transport, with the resulting lower wire count and reduced signal density allowing use of lower-cost interconnection such as an organic rather than a silicon interposer between GPU and DRAM stack.

BRIEF DESCRIPTION OF FIGURES

FIG. 11 shows Tables I, II, and III enumerating the contents of each CNRZ-5 channel or bit, for each frame of information communicated over EHBM.

DETAILED DESCRIPTION

Figure 1:
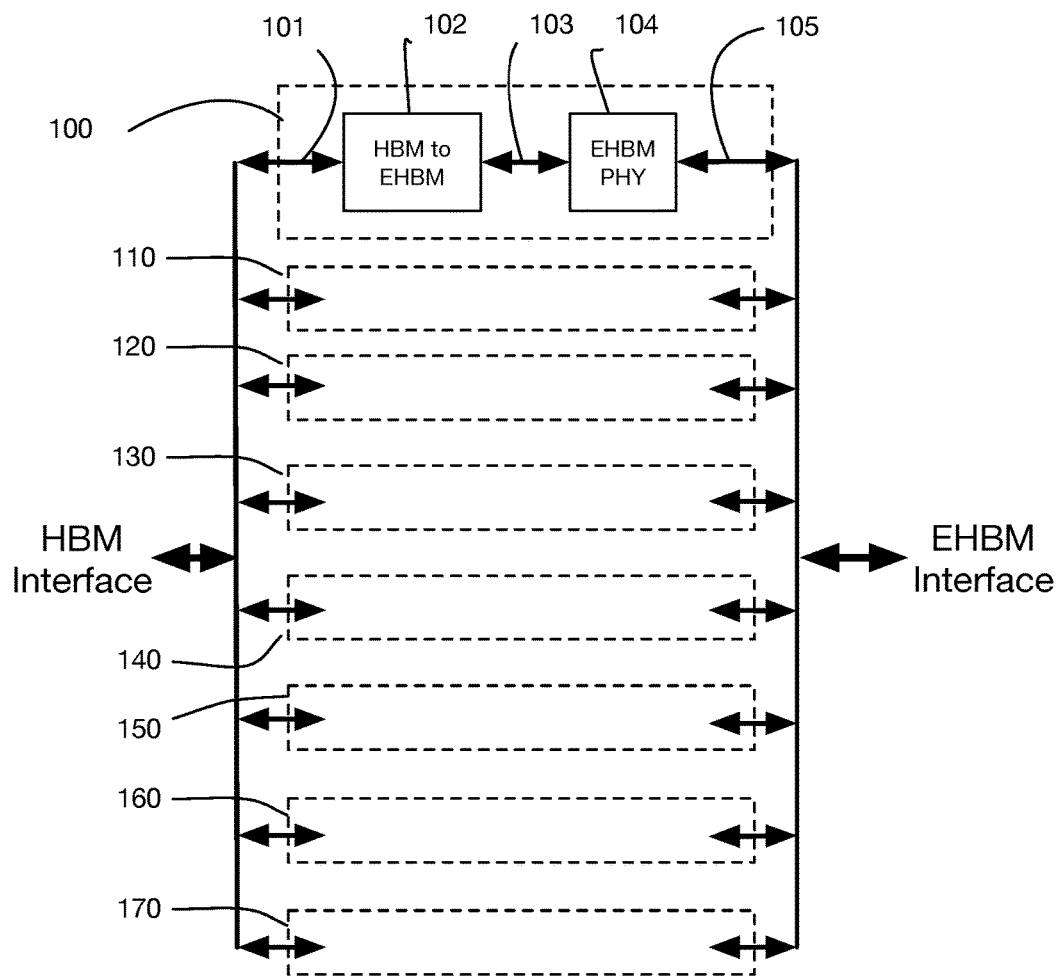
FIG. 1 is a block diagram of one embodiment converting HBM channels of a HBM interface to EHBM channels of an EHBM interface.

The High Bandwidth Memory (HBM) interface is a relatively new, high performance memory variant intended for networking, graphics processing, HPC, and server applications. HBM uses Thru Silicon Via (TSV) technology to carry a slow, very wide interface between stacked DRAM dies to a base layer device, which is typically fabricated using a DRAM semiconductor process. This base layer device can then connect to a processing device in a 3D stack configuration. A more common way to connect HBM is in a 2.5D configuration where a silicon interposer or a complex many-layer organic interposer is used to connect the more than 1700 wires needed between the processor device and the HBM stack.

Unfortunately, both of these advanced interposer technologies are expensive as compared to fine-pitch (noninterposer) MCM packaging technology or few-layer, simple organic interposers. Semiconductor dies that use microbumps to connect to silicon interposers are also known to be difficult to probe on automated testers because of their very fine pitch. The probe arrays that are needed are expensive and fragile.

An Extended HBM (EHBM) interface can be constructed that has excellent properties. This EHBM interface carries the full and massive bandwidth of a full HBM stack over a dramatically narrower interface. In one EHBM embodiment, a 212-wire, 2 GT/s HBM channel can be carried over a 40-wire, 16 GT/s EHBM channel. EHBM may be interfaced to existing HBM DRAM devices using an EHBM base layer device fabricated with a logic process. This EHBM base layer connects on its top side to known art HBM DRAM memory dies using TSVs, and on its bottom side via EHBM to processing devices using fine-pitch Multi-Chip Modules (MCMs), few-layer organic interposers, or in certain applications conventional printed circuit boards. Other EHBM to DRAM interfaces are also possible, combining existing HBM base layer chips with an adjacent EHBM-to-HBM conversion or translation device.

As defined by [JEDEC HBM], a full HBM interface supports eight HBM channels operating essentially independently. Each channel is capable of commanding, reading from, or writing to a DRAM. When directly interfaced to a stacked DRAM, a channel controls one independently-operating DRAM bank; in the embodiment of [Lee et al] each DRAM device in the stack contains two such banks, although other embodiments may have fewer or more banks per device. As this document is mainly concerned with host and base layer embodiments terminating the full HBM interface, unless otherwise specified a HBM interface herein will be presumed to be comprised of eight HBM channels, and an EHBM interface thus also will be comprised of eight EHBM channels. It should be noted that beyond the 212 high-speed signals per channel, the full HBM DRAM specification also defines five low-speed global signals, as well as an IEEE 1500 test port; unless otherwise stated herein, it is assumed that transport of those signals is outside the scope of the high-speed EHBM interface.

EHBM preserves HBM's independent channel architecture by transparently transporting the multiple HBM channels within the overall EHBM interface. As illustrated in FIG. 1, the HBM interface is comprised of eight HBM channels. Handling of one representative channel is shown as 100 in FIG. 1, with the HBM channel 101 being processed by HBM to EHBM translator 102, which performs transparent conversion of HBM commands and data transfers into EHBM protocol messages 103 and vice versa. EHBM relies on an EHBM PHY 104 for interface to physical transport media 105 (typically, a collection of physical point-to-point traces on an interposer or within a multi-chip module). The collection of such EHBM physical transport wires for all channels constitutes the complete PHY Interface. Processing of each channel is identical, thus the descriptions of 100 also apply to 110, 120, 130, 140, 150, 160 and 170.

As the eight channels are identical, further description will focus on the embodiment of a single channel such as 100, with the overall embodiment comprised of parallel, equivalent, and essentially independent replications of the described channel elements and actions. In embodiments interfacing to conventional HBM memory, the elements of FIG. 1 are duplicated in reverse order at the other end of the EHBM transport, to convert each channel back to HBM again. As will be obvious to one familiar with the art, other embodiments may subset or otherwise selectively incorporate elements of 100 to, as examples offered without limitation, implement direct EHBM-attached memory devices and/or memory controllers issuing or receiving and acting upon memory commands over EHBM without full conversion to a physical HBM channel. Embodiments may also expand upon basic HBM functionality by incorporating additional error controls, extended addressing, or other capabilities.

Transport in EHBM

Physical signal transport in EHBM is performed using multiple Kandou CNRZ-5 channels, also known as Glasswing channels as described in [Hormati I]. Each CNRZ-5 channel transparently communicates five bits of data encoded as a chordal code transmitted over six physical interconnection wires from transmitting device to receiving device. An additional two wires are used to communicate a clock signal from transmitter to receiver; in some embodiment, that clock may be shared by multiple CNRZ-5 channels operating in a synchronous manner. In some embodiments, a co-located CNRZ-5 transmitter and receiver may share the same physical six interconnection wires to alternately transmit and receive, in the well-known time-division duplexing method. In such embodiments, direction of signal flow on those wires is determined by the requested HBM operation for the channel as a whole.

The matrix of Eqn. 1 describes coefficients for a set of multi-input comparators representing a CNRZ-5 receiver.

$$\begin{matrix} 1 & 1 & 1 & 1 & 1 & 1 \\ 1 & -1 & 0 & 0 & 0 & 0 \\ 1/2 & 1/2 & -1 & 0 & 0 & 0 \\ 0 & 0 & 0 & 1 & -1 & 0 \\ 0 & 0 & 0 & 1/2 & 1/2 & -1 \\ 1/3 & 1/3 & 1/3 & -1/3 & -1/3 & -1/3 \end{matrix} \quad \text{(Eqn. 1)}$$

In this embodiment, six input wires, represented by the six matrix columns, are processed by five multi-input comparators represented by matrix rows 2-6. For purposes to be subsequently described, the first matrix row is comprised of all "1" values, creating a square 6×6 matrix.

Figure 2:
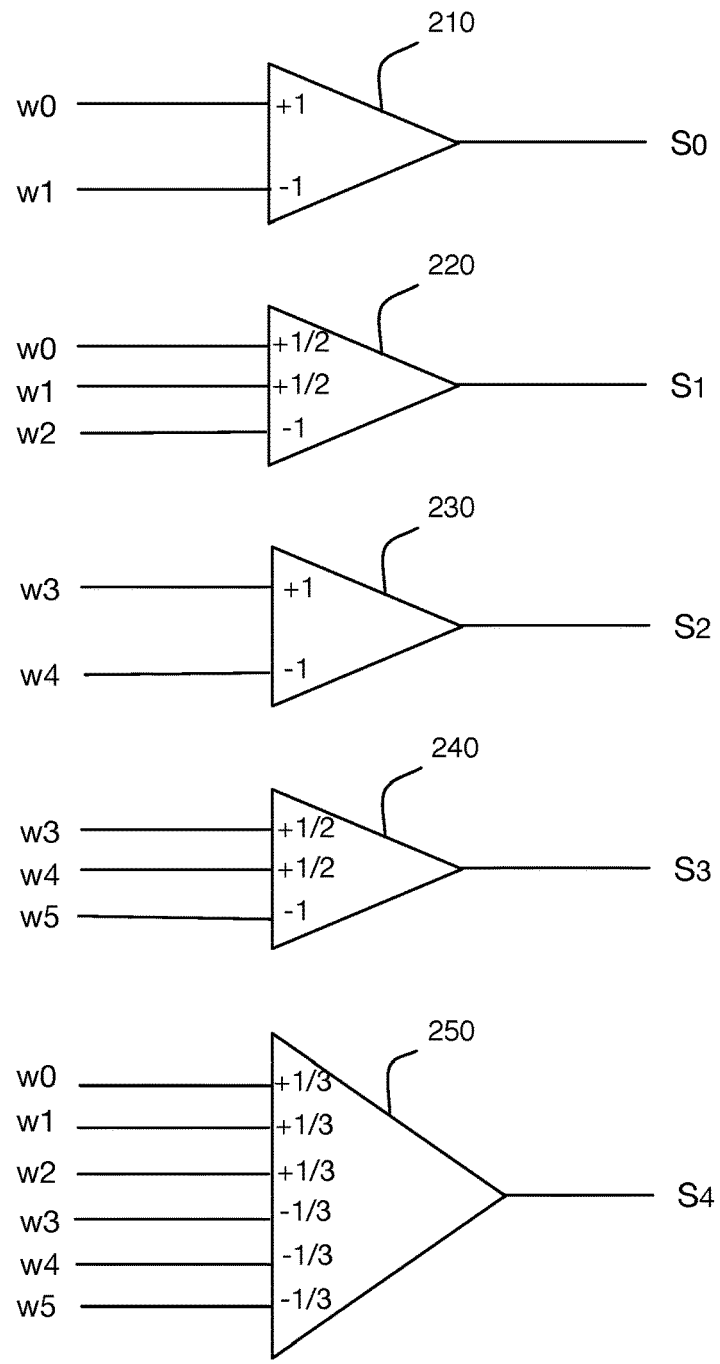
FIG. 2 is a block diagram of a Glasswing (CNRZ-5) receiver, in accordance with some embodiments.

An embodiment of the Glasswing receiver as defined by the matrix of Eqn. 1 is shown in FIG. 2. The six input wires are $w_0$ through $w_5$, and the five sub-channel outputs are $S_0$ through $S_5$. In the drawing convention used here, each of the inputs of the multiple-input comparators 210 through 250 is identified by a weight, representing the relative contribution of that input to the final result output, as defined by the matrix rows of Eqn. 1 defining each MIC. Thus, 210 and 230 may be seen to be conventional dual input differential comparators, each having one positive and one negative input of equal and opposite weight. Comparators 220 and 240 each have two positive inputs each contributing one half to the total positive value, and one input contributing the entire negative value. Comparator 250 has three inputs each contributing one third to the total positive value, and three inputs each contributing one third to the total negative value.

As used herein, a matrix M such as that of Eqn. 1 is called "orthogonal" if $M^T M = D$ that is, if the product of the matrix and its transpose is a diagonal matrix having non-zero values only on its diagonal. This is a weaker definition than commonly used, where the result is required to be the identity matrix, i.e. having diagonal values equal to 1. Matrix M may be normalized to satisfy the stronger conventional orthogonality requirement, but as will subsequently be described such normalization is neither necessary nor desirable in practice.

Functionally, orthogonality requires that the vector of weights in a row representing a multi-input comparator be orthogonal to all other rows, and that each row representing a multi-input comparator sums to zero. As this implies the comparator outputs are also orthogonal (and therefore independent) they represent distinct communications modes, herein described as "sub-channels" of the Vector Signaling Code communications system.

Given this modal interpretation, the initial row of the matrix may be seen to represent the common-mode communications channel over the transmission medium. As it is desirable in a practical system for the receiver to have common-mode rejection, the first row is set to all "1" values, maximizing the common mode contribution of each wire input to this one matrix row. As by definition all rows of the matrix are orthogonal, it follows that no other matrix row (i.e. no receiver output) may then be impacted by common mode signals. Embodiments having such common mode rejection need not implement a physical comparator corresponding to the first row of their descriptive matrix.

For avoidance of confusion, it is noted that all data communications in an ODVS system, including the state changes representing signals carried in sub-channels, are communicated as codewords over the entire channel. An embodiment may associate particular mappings of input values to codewords and correlate those mappings with particular detector results, as taught herein and by [Holden I] and [Ulrich I], but those correlations should not be confused with partitions, sub-divisions, or sub-channels of the physical communications medium itself. Similarly, the concept of ODVS sub-channels is not limited by the example embodiment to a particular ODVS code, transmitter embodiment, or receiver embodiment. Encoders and/or decoders maintaining internal state may also be components of embodiments. Sub-channels may be represented by individual signals, or by states communicated by multiple signals.

[Shokrollahi II] describes methods of constructing orthogonal matrices that may be utilized as described herein.

As described in [Cronie I] and [Cronie II], an Orthogonal Differential Vector Signaling code may be constructed from a generator matrix by multiplication of an input modulation vector of the form $(0, a_1, a_2, \ldots a_n)$ by the matrix M. In the simplest case, each $a_i$ of this vector is the positive or negative of a single value, as example ±1, representing one bit of transmitted information.

Given our understanding of M as describing the various communications modes of the system, it may readily be seen that multiplication of the matrix by such an input vector comprises excitation of the various modes by the $a_i$ of that vector, with the zeroth mode corresponding to common mode transmission not being excited at all. It will be obvious to one familiar with the art that transmission energy emitted in the common mode is both unnecessary and wasteful in most embodiments. However, in at least one embodiment, a nonzero amplitude for the common mode term is used to provide a nonzero bias or baseline value across the communications channel.

It also may be seen that the various codewords of the code generated using this method represent linear combinations of the various orthogonal communication modes. Without additional constraints being imposed (e.g., for purposes of implementation expediency) this method results in systems capable of communicating N−1 distinct sub-channels over N wires, typically embodied as a N−1 bit/N wire system. The set of discrete codeword values needed to represent the encoded values is called the alphabet of the code, and the number of such discrete alphabet values is its alphabet size.

As a further example, the code generated by this method from the matrix of Eqn. 1 is shown in Table 1.

TABLE 1

| | |
|---|---|
| ± [1, 1/3, −1/3, −1, −1/3, 1/3] | ± [1, 1/3, −1/3, 1/3, −1, −1/3] |
| ± [1/3, 1, −1/3, −1, −1/3, 1/3] | ± [1/3, 1, −1/3, 1/3, −1, −1/3] |
| ± [1/3, −1/3, 1, −1, −1/3, 1/3] | ± [1/3, −1/3, 1, 1/3, −1, −1/3] |
| ± [−1/3, 1/3, 1, −1, −1/3, 1/3] | ± [−1/3, 1/3, 1, 1/3, −1, −1/3] |
| ± [1, 1/3, −1/3, −1, 1/3, −1/3] | ± [1, 1/3, −1/3, 1/3, −1/3, −1] |
| ± [1/3, 1, −1/3, −1, 1/3, −1/3] | ± [1/3, 1, −1/3, 1/3, −1/3, −1] |
| ± [1/3, −1/3, 1, −1, 1/3, −1/3] | ± [1/3, −1/3, 1, 1/3, −1/3, −1] |
| ± [−1/3, 1/3, 1, −1, 1/3, −1/3] | ± [−1/3, 1/3, 1, 1/3, −1/3, −1] |

As may be readily observed, the alphabet of this code includes the values +1, +⅓, −⅓, −1, thus this is a quaternary code (e.g. having an alphabet size of four.) This code will subsequently be described herein as the 5b6w or "Glasswing" code, and its corresponding receive matrix of Eqn. 1 as the "Glasswing receiver".

EHBM Clock Management

It should be noted that in the HBM to EHBM to DRAM systems discussed herein, there are multiple "clock" signals: The host controller generates and the DRAM devices receive the primary 1 GHz CK clock; data strobes WDQS and RDQS are associated with HBM data transfers; and the EHBM CNRZ-5 channels are similarly associated with high frequency data transfer clocks.

Interfacing with the host device, a HBM to EHBM interface accepts clock CK and accepts data strobes WDQS and RDQS to exchange data DQ and command/status information with the host device. Interfacing with a memory device, an EHBM to HBM interface similarly produces clock CK and produces data strobes WDQS and RDQS to exchange data DQ and control/status information with the memory device.

Generally speaking, EHBM CNRZ-5 clocks are distinct from both interface CK and WDQS/RDQS clocks, although in some embodiments the latter may be obtained from a common clock generation source, such as a PLL, associated with the former. The transfer rate of the CNRZ-5 channels is primarily determined by the distance, electrical characteristics, and topology of the high-speed interconnection used for transport, with various embodiments known in the range of 16-28 GBaud/second. As described by [Hormati I], a fractional rate synchronization clock is typically used, the transmitted interface clock rate depending on the PLL characteristics, number of interface processing phases, and other design decisions.

Figure 3:
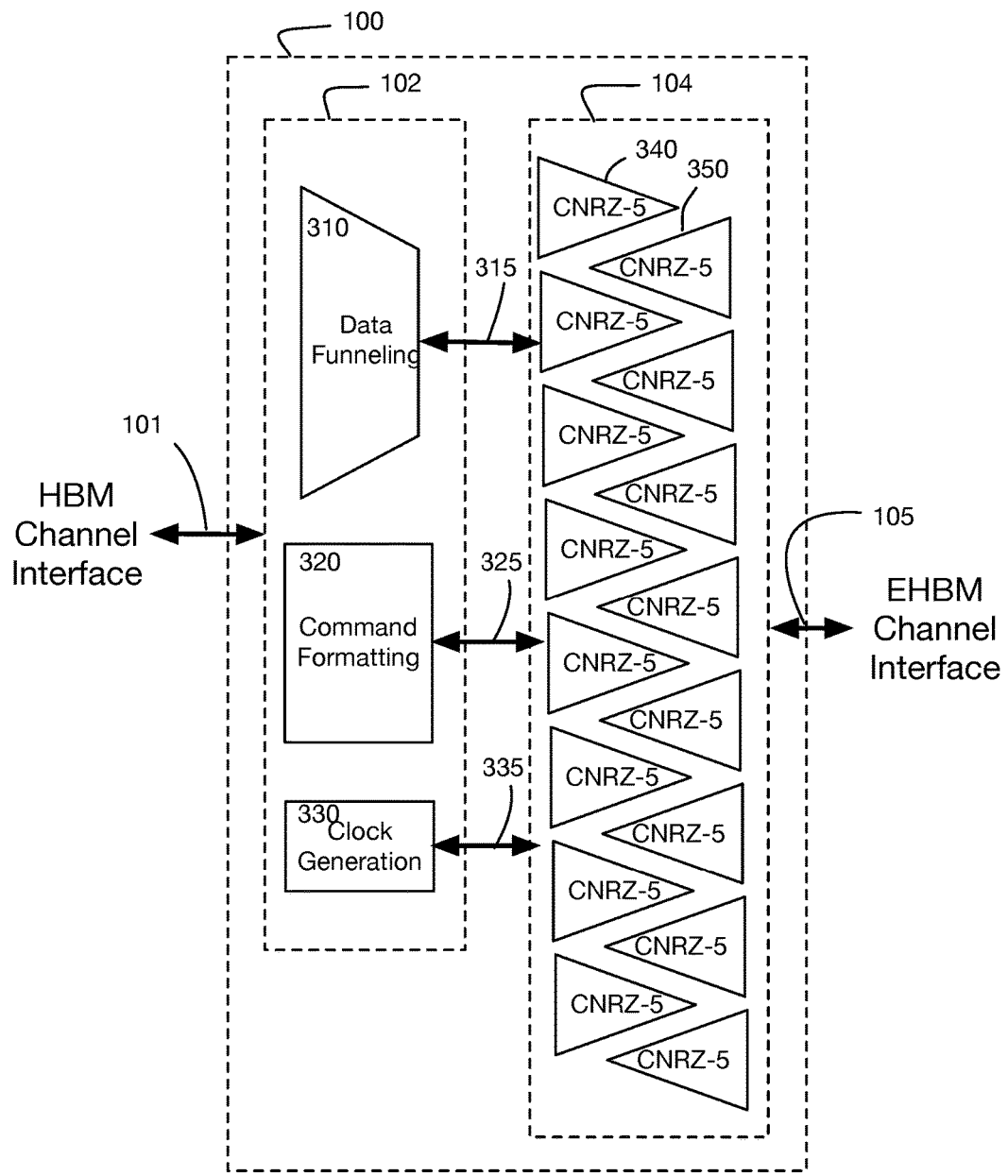
FIG. 3 is a block diagram detailing the internal architecture of a first embodiment of a single channel HBM to EHBM interface as in FIG. 1.

FIG. 3 expands the representative channel 100 of FIG. 1 to provide a more detailed architectural view, showing HBM to EHBM conversion 102 as comprised of Data funneling 310, Command formatting 320, and Clock generation 330 elements, and the EHBM PHY 104 as comprised of multiple instances of CNRZ-5 transmitters (also referred to herein as encoders) 340 and CNRZ-5 receivers (also referred to herein as decoders) 350.

The functional parameters of these elements must be coordinated, as determined by transfer parameters for the EHBM physical transport layer they rely upon, in particular the transfer width of the physical layer as compared to the data width of HBM transfers, and the transfer rate of the physical layer as compared to the HBM transfer rate. Native HBM transfers are performed on 128 bit data words, typically occurring at a 1-2 GigaTransfer/second rate in contemporary devices. Conversely, the EHBM physical transport layer is narrower but operate at significantly higher speed. Thus, a single HBM transfer must be converted into multiple EHBM operations while the wide HBM data words are converted into shorter units for EHBM communication. Some embodiments utilize forward-error-correction (FEC) algorithms to augment the basic HBM data path with error correction bits, allowing errors introduced during EHBM transit to be identified and repaired. Some embodiments similarly augment HBM command/status information with address extension, FEC, and link support information to provide similar communications robustness and support additional functionality.

Figure 4:
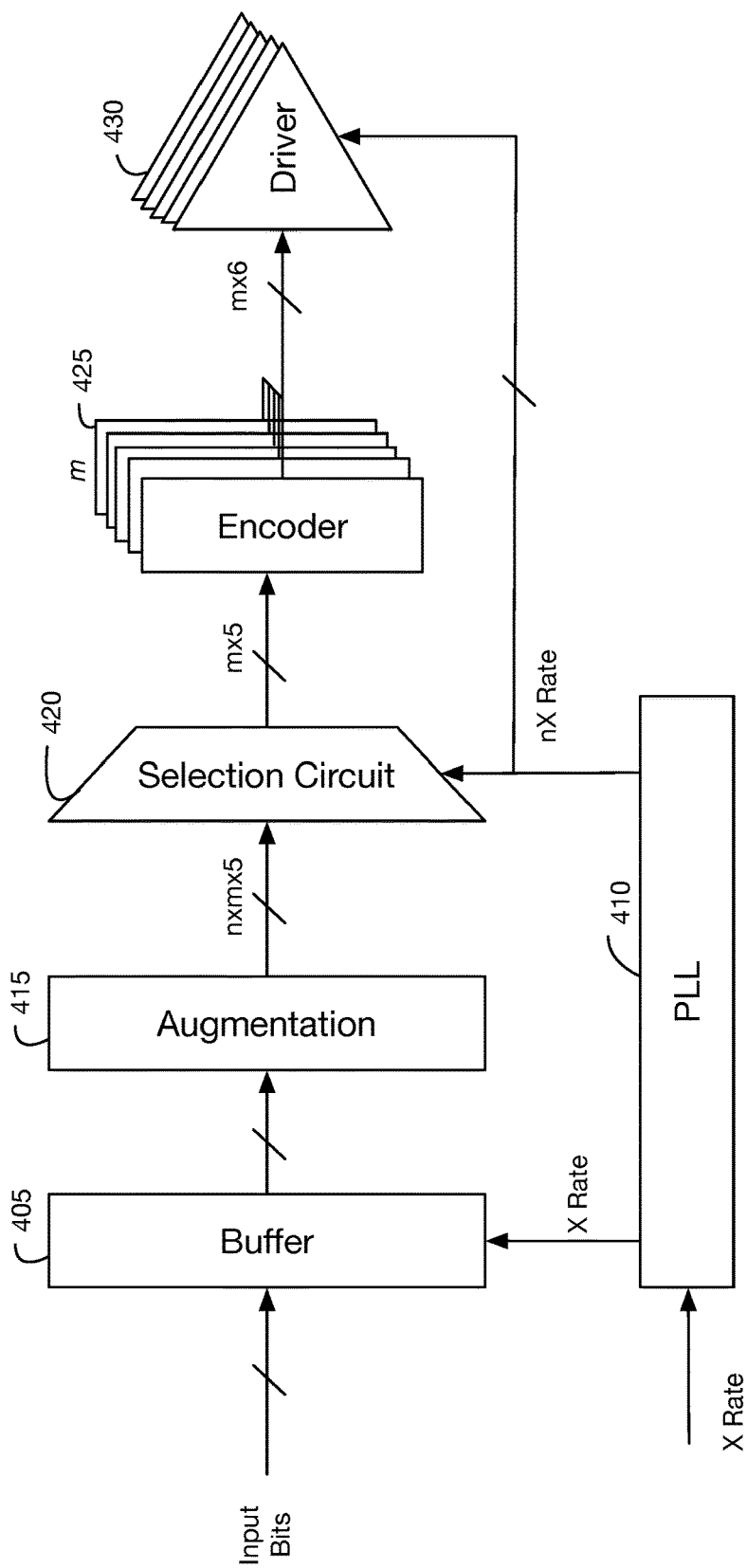
FIG. 4 is a block diagram of a HBM to EHBM interface, in accordance with some embodiments.

FIG. 4 is a block diagram of an HBM to EHBM interface, in accordance with some embodiments. As shown, FIG. 4 includes a buffer 405 configured to receive a set of bits in parallel over a first multi-wire bus, the plurality of bits comprising data bits and control bits, a phase-locked loop 410 configured to receive a clock signal associated with the received set of bits and to generate a selector signal and at least one high-rate clock signal from the received associated clock signal, the selector signal and high-rate clock signal having a rate nX higher than the received associated clock signal, wherein n is an integer greater than or equal to 1, an augmentation circuit 415 configured to receive the set of bits and to generate an augmented set of bits by augmenting the received set of bits with at least forward error correction (FEC) bits, the augmented set of bits comprising 5×n×m bits, wherein m is an integer greater than or equal to 1, a selection circuit 420 configured to receive the augmented set of bits, and to select m sets of 5 bits from the augmented set of bits according to the selector signal, m encoders 425 configured to generate n sets of m codewords, each set of m codewords generated in a respective transmission interval of n consecutive transmission intervals, wherein for a given set of m codewords, the encoder is configured to receive the selected m sets of 5 bits from the selection circuit and to generate the given set of m codewords, each codeword generated based on a transformation of a respective set of 5 bits of the selected m sets of 5 bits with a non-simple orthogonal matrix, and a plurality of drivers 430 configured to transmit the n sets of m codewords according to the at least one high-rate clock signal over a second multi-wire bus, each of the sets of m codewords transmitted in a corresponding transmission interval, wherein the second multi-wire bus has a fewer number of wires than the first multi-wire bus.

In some embodiments, each codeword comprises 6 symbols. In some embodiments, each symbol has a symbol value selected from a quaternary alphabet. In some embodiments, the quaternary alphabet comprises symbol values selected from the set [±1, ±⅓].

In some embodiments, n=8 sets of m=5 codewords are sent over n=8 transmission intervals. In some embodiments, the second multi-wire bus comprises 50 wires. In some embodiments, n=5 sets of m=8 codewords are sent over n=5 transmission intervals. In some embodiments, the second multi-wire bus comprises 128 wires.

In some embodiments, the at least one high-rate clock signal comprises a single high-rate clock signal, and wherein the plurality of drivers is configured to transmit each set of m codewords according to the single high-rate clock signal. In alternative embodiments, the at least one high-rate clock signal comprises m high-rate clock signals, and wherein the plurality of drivers is configured to transmit each codeword of a given set of m codewords according to a corresponding high-rate clock signal of the m high-rate clock signals.

In some embodiments, the apparatus further includes m decoders configured to receive n sets of m codewords on the second multi-wire bus in n consecutive receive intervals, and for each receive interval, the m decoders configured to decode each codeword into a corresponding set of 5 bits and a formatting circuit configured to form a set of output bits by concatenating decoded sets of 5 bits formed over the n consecutive receive intervals. In some embodiments, a subset of the n sets of m codewords are received on unidirectional wires. In some embodiments, a subset of the n sets of m codewords are received on bidirectional wires.

Without implying any limitation, three example embodiments will be described, each of which utilizes multiple CNRZ-5 channels, augments the 128 HBM data bits with 16 bits of write data mask and 16 FEC bits to a total of 160 data bits, and similarly augments the HBM control and status words to a total of 40 bits.

The first example embodiment utilizes m=8 CNRZ-5 channels in parallel per HBM channel per direction, and is capable of transporting the contents of one HBM transfer in n=5 CNRZ-5 unit intervals. The second embodiment utilizes m=5 CNRZ-5 channels in parallel per HBM channel per direction, and is capable of transporting the contents of one HBM transfer in n=8 CNRZ-5 unit intervals. Each CNRZ-5 channel in these embodiments is separately clocked using respective high-rate clocks, thus eight unidirectional signal wires are needed per channel per direction, for a total of 128 wires per EHBM channel for the first embodiment, and a total of 80 wires per EHBM channel for the second embodiment.

A third example embodiment utilizes the same control/ data organization as the second embodiment, but with transport organized into one unidirectional CNRZ-5 channel in the host to memory direction, one unidirectional CNRZ-5 channel in the memory to host direction, and four CNRZ-5 channels operating in a time-duplexed bidirectional mode. Thus, for any given HBM operation five CNRZ-5 channels (a total of 25 bits) are available for transport of data and control information in the selected direction, and one CNRZ-5 channel (five bits) is available for transport of error or status information in the return direction. A single high-rate clock is used for all CNRZ-5 channels, carried by dedicated differential pairs in each direction. Only 40 wires are used per channel in this embodiment, however the additional constraints imposed by the duplex operation may limit transfer rate, in one embodiment to 16 GT/second.

Figure 5:
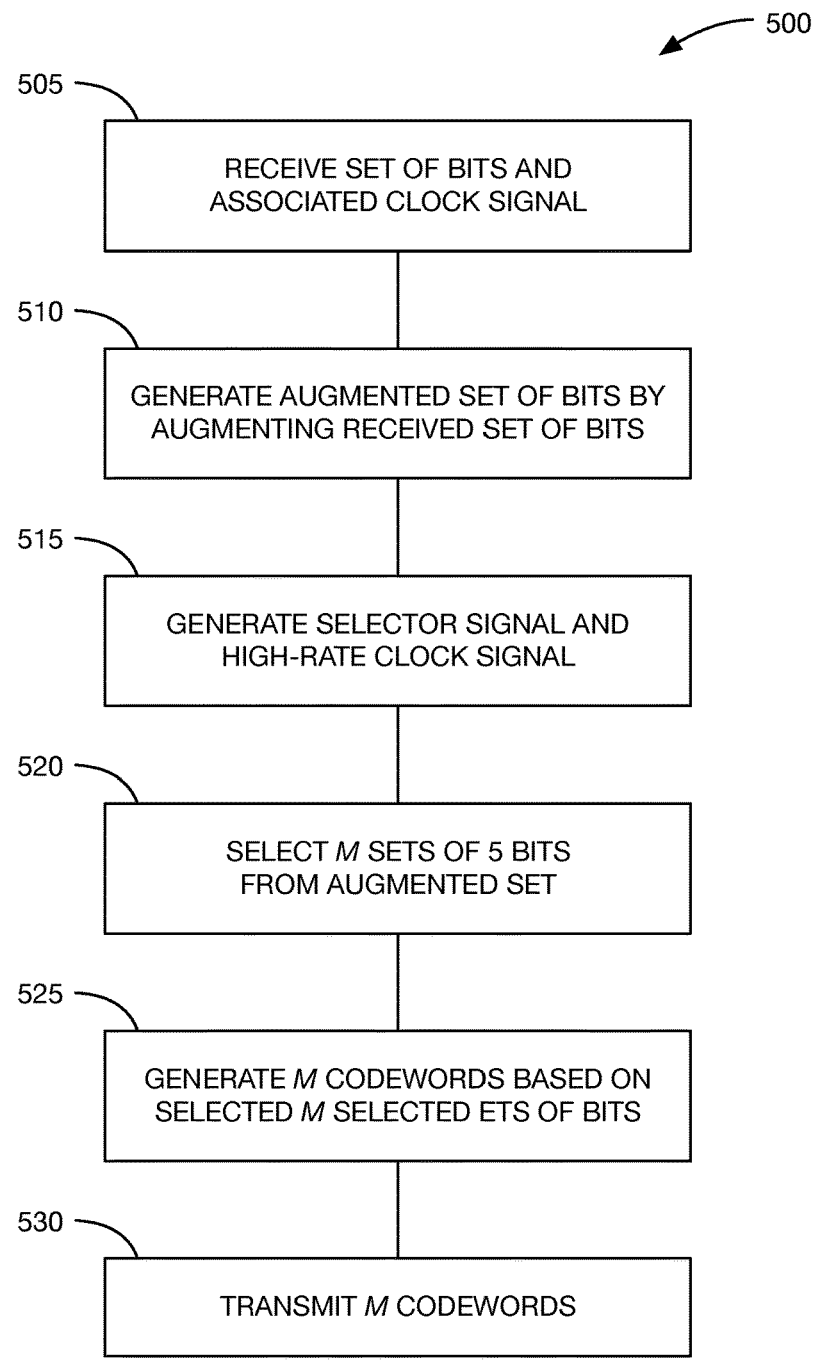
FIG. 5 is a flowchart of a process in accordance with some embodiments.

FIG. 5 is a flowchart of a method 500, in accordance with some embodiments. As shown, the method includes receiving, at 505, a set of bits and an associated clock signal in parallel over a first multi-wire bus, the plurality of bits comprising data bits and control bits, generating, at 510, an augmented set of bits by augmenting the received set of bits with at least forward error correction (FEC) bits, the augmented set of bits comprising 5×n×m bits, wherein n and m are integers greater than or equal to 1, generating, at 515, a selector signal and at least one high-rate clock signal from the received associated clock signal, the selector signal and high-rate clock signal having a rate nX higher than the received clock signal, generating n sets of m codewords, each set of m codewords generated in a respective transmission interval of n consecutive transmission intervals, wherein generating a given set of m codewords includes selecting, at 520, m sets of 5 bits from the augmented set of bits according to the selector signal and generating, at 525, the given set of m codewords, each codeword generated based on a transformation of a respective set of 5 bits of the selected m sets of 5 bits with a non-simple orthogonal matrix, and transmitting, at 530, the n sets of m codewords according to the at least one high-rate clock signal over a second multi-wire bus, each of the sets of m codewords transmitted in a corresponding transmission interval, wherein the second multi-wire bus have a fewer number of wires than the first multi-wire bus.

In some embodiments, each codeword comprises 6 symbols. In some embodiments, each symbol has a symbol value selected from a quaternary alphabet. In some embodiments, the quaternary alphabet comprises symbol values selected from the set [±1, ±⅓].

In some embodiments, n=8 sets of m=5 codewords are sent over n=8 transmission intervals. In further embodiments, the second multi-wire bus comprises 50 wires. In even further embodiments, the second multi-wire bus comprises 60 wires, including 30 for receivers. In some embodiments, n=5 sets of m=8 codewords are sent over n=5 transmission intervals. In such embodiments, the second multi-wire bus comprises 128 wires.

In some embodiments, the at least one high-rate clock signal includes a single high-rate clock signal, and wherein each set of m codewords is transmitted according to the single high-rate clock signal. In alternative embodiments, the at least one high-rate clock signal comprises m high-rate clock signals, and wherein each codeword of the given set of m codewords is transmitted according to a corresponding high-rate clock signal of the m high-rate clock signals.

In some embodiments, the method further includes receiving n sets of m codewords on the second multi-wire bus in n consecutive receive intervals, and for each receive interval, decoding each codeword into a corresponding set of 5 bits, and forming a set of output bits by concatenating each set of 5 bits. In some embodiments, a subset of the n sets of m codewords are received on unidirectional wires. In some embodiments, a subset of the n sets of m codewords are received on bidirectional wires.

Maximum Throughput EHBM Embodiment

To maximize communications bandwidth, a first embodiment maintains each six wire physical interconnection in a half-duplex mode, dedicating each corresponding CNRZ-5 channel to operation in either a host-to-memory direction or in a memory-to-host direction. A separate clock pair is used for or each CNRZ-5 channel to minimize the effects of skew and to simplify clock routing within the receiver, for a total of eight wires used for each CNRZ-5 instance.

The embodiment is optimized to maximize throughput while remaining within the wire count of a native HBM interface. Each HBM channel transported over EHBM utilizes 5 CNRZ-5 channels in the host-to-memory direction and 5 CNRZ-5 channels in the memory-to-host direction for data, and an additional 3 CNRZ-5 channels in the host-to-memory direction and 3 CNRZ-5 channels in the memory-to-host direction for control signals and other ancillary information. A total of ((5+3)*2)*8=128 wires are used for each EHBM Channel Interface 105 in this embodiment.

HBM channel data transfers are 128 bits wide, and this embodiment adds an additional 16 bits for byte masking and 16 bits for forward error control (FEC) using known art FEC algorithms. The corresponding command/aux signaling totals 40 bits per transfer, for a total of 200 bits to be transferred over a 25+15=40 bit signal path in five consecutive CNRZ-5 unit intervals, corresponding to a delivered data transfer rate of 81.92 GigaBytes/second per EHBM channel, sufficient to support HBM devices performing up to 5.12 GigaTransfers/second.

As seen in the architectural overview of FIG. 3, in this first embodiment there are eight instances of CNRZ-5 transmitter 340 and eight instances of CNRZ-5 receiver 350 which comprise the EHBM PHY 104 in this embodiment. Each CNRZ-5 transmitter 340 accepts five data bits from Data Funneling 310 or five control/status bits from Command Formatting 320 as selected by multiplexers 650 and 660 (shown in FIG. 6) respectively, and well as one clock signal from Clock Generation 330 for transmission. Similarly, each CNRZ-5 receiver detects five received bits and one clock. Five such instances are accepted by Data funneling 310 and three such instances are accepted by Command Formatting 320; the received clocks are processed by Clock Generation 330 to manage these internal transfers as well as under some conditions provide a clock to HBM Channel Interface 101.

Skew Compensation

As each CNRZ-5 channel is separately clocked, each CNRZ-5 receiver utilizes its own clock to capture received data at each unit interval. To eliminate the effects of skew across multiple CNRZ-5 channels, known art deskewing methods are utilized to realign received channel data into coherent received words. In some embodiments, a wide but shallow FIFO may be utilized in the data path, with each 5 bit input component being clocked in by a local CNRZ-5 receive clock, and the overall output being clocked out by a local clock operating at the same frequency but not necessarily the same phase as any receive clock. One embodiment utilizes a first FIFO to capture data words, and a second FIFO to capture control/status information. In some embodiments, FIFO buffering is implemented across the entire transfer word; in other embodiments, each HBM half-transfer (i.e. the 64 bits of data transferred per HBM clock transition) is buffered separately.

In embodiments in which the relative timings of the various CNRZ-5 channel clocks and the HBM clock are sufficiently well bounded, a single level of FIFO buffering e.g. a layer of clocked latches, may be sufficient to efficiently and reliably pass data between these clock domains. As data passing in the HBM to EHBM direction generally satisfies this criterion, the embodiment of FIG. 6 utilizes single level latching, with this illustrative option implying no limitation.

In some embodiments, such single level FIFO buffering via latches may be combined with a data funneling function by consecutively enabling different latches on successive receive unit intervals, said latches then being read out essentially in parallel. In an alternative embodiment, a data shift register performs the equivalent function of the consecutively enabled different latches, as illustrated in FIG. 4 where each individually clocked CNRZ-5 receiver provides data to its own shift register. As before, this illustrative option implies no limitation in other embodiments.

Figure 6:
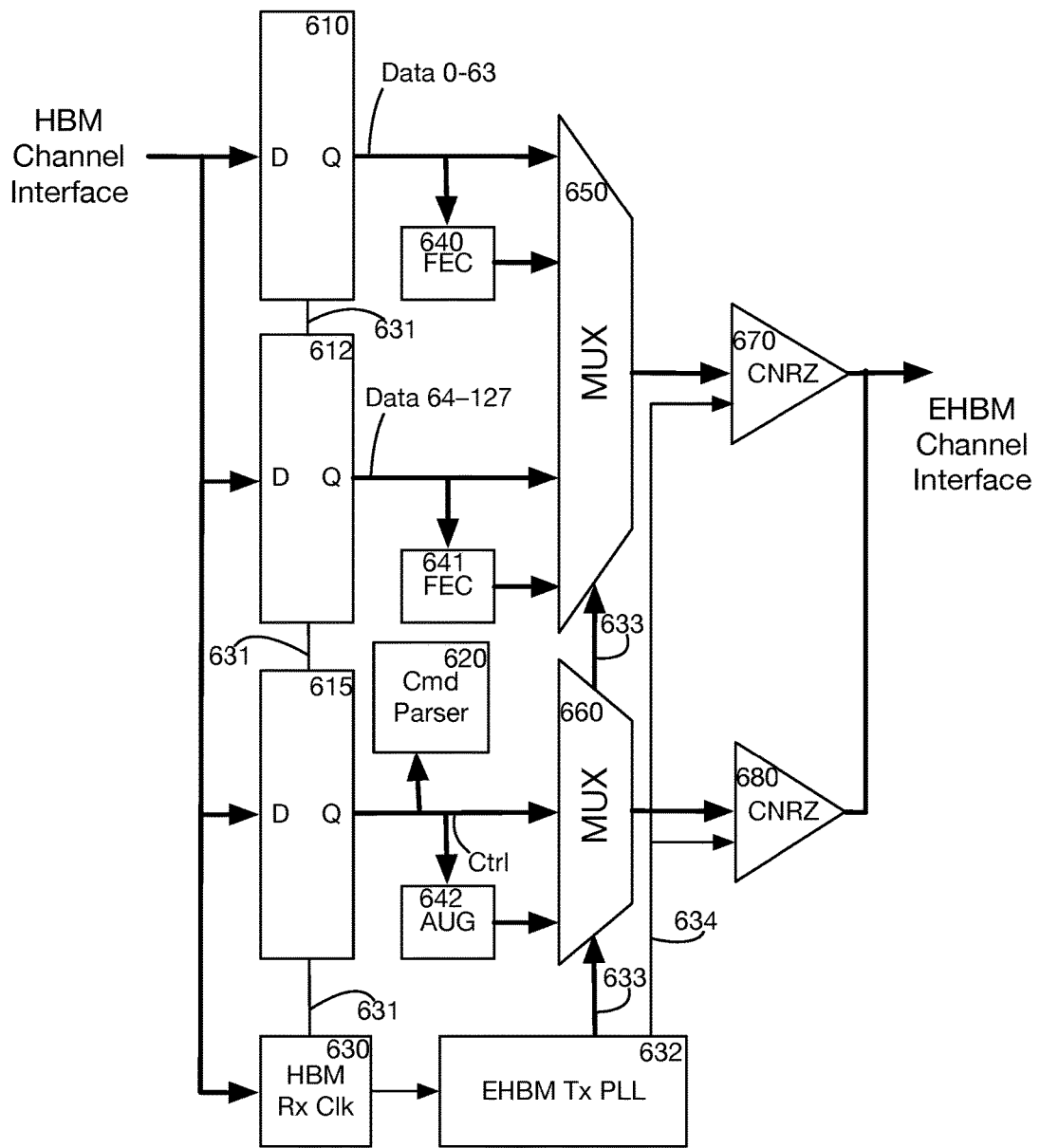
FIG. 6 is a block diagram detailing one embodiment's EHBM transmit processing.

FIG. 6 details the data paths in the HBM to EHBM direction, as one example during a Host-to-DRAM write operation. As will be well understood by one familiar with the art, HBM channel interface 101 is comprised of data or "DQ" signals, clock signals including WDQS and RDQS, and control signals. Data signals are captured in Data Latches 610 and 612, here shown respectively capturing Data bits 0-63 and Data bits 64-128. Control signals are similarly latched 615 and parsed 620 so that the HBM to EHBM converter is aware of the type of transfer being performed. As shown, Data latches 610/612 and control latch 615 are part of buffer 405 as shown in FIG. 4. HBM clocks are received 630, used 631 to latch data and control signals, and processed by EHBM Tx PLL 632 to produce the higher-rate clocks for the EHBM interface, in this embodiment at 5× the HBM transfer rate, as five EHBM transfers are used to transmit the information in one HBM transfer. As shown, EHBM Tx PLL 632 may have a similar structure and function as PLL 410 as shown in FIG. 4.

Data 0-63 and Data 64-127 are augmented using an augmentation circuit 415 by computation of Forward Error Correction codes at 640 and 641, and Control information is Augmented 642 with additional control, status, and extension fields, with the resulting Data and Data augmentation presented to selection circuit 420 including Multiplexer 650 and the resulting Control and Control augmentation presented to Multiplexer 660. EHBM Tx PLL 632 also produces selector signals 633 which direct Multiplexors 650 and 660 to select appropriate subsets of inputs for transmission in consecutive EHBM unit intervals. Each consecutive subset of multiplexor inputs is output to CNRZ output drivers 670 and 680 along with an appropriately phased Tx clock 634 provided by EHBM Tx PLL 632.

Figure 7:
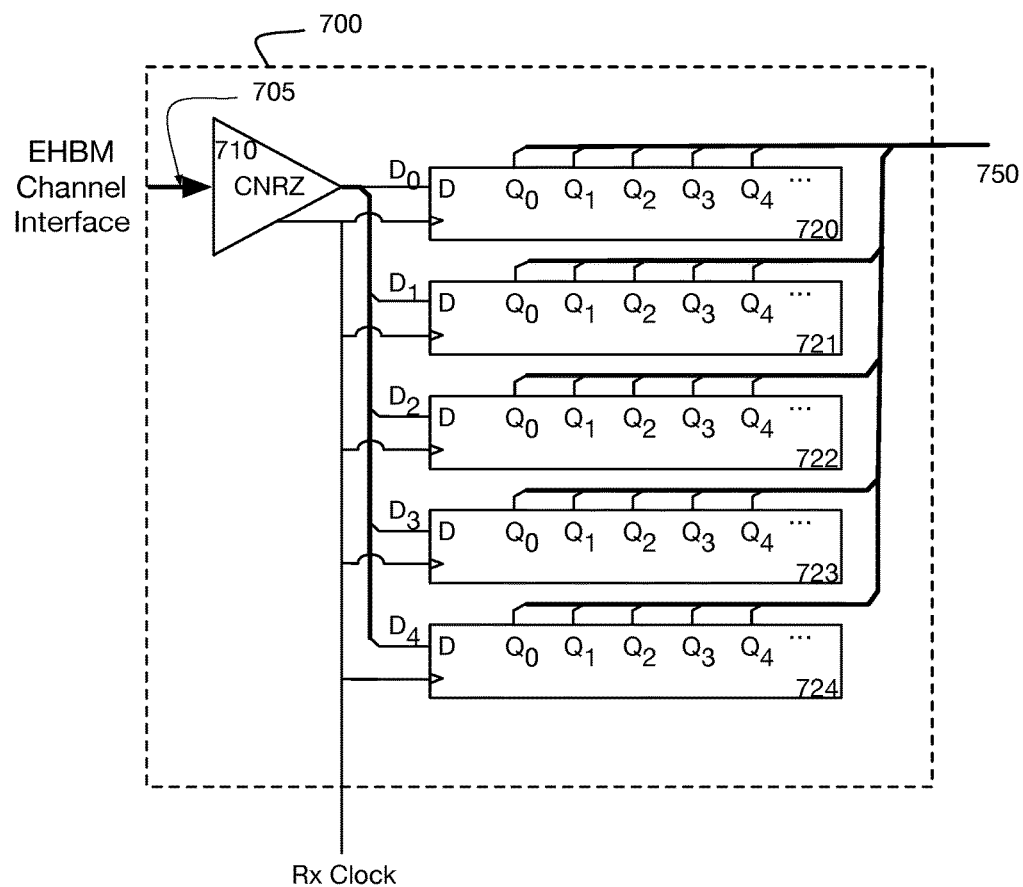
FIG. 7 is a block diagram showing one CNRZ-5 receiver and its associated deskew buffering in one embodiment.

FIG. 7 details the data paths in the EHBM to HBM direction. As previously described, the EHBM channel is received by multiple instances of CNRZ-5 receivers each associated with its own receive clock, thus requiring skew compensation to align results obtained across multiple CNRZ-5 receivers.

For illustrative clarity, one instance 700 of a CNRZ-5 receiver and its receive skew compensation is detailed in FIG. 7, in this example utilizing shift registers to implement the FIFO deskew function. CNRZ-5 receiver 710 accepts 705 six wire inputs for data and two wire inputs for clock and produces five detected data values which are captured by shift registers 720, 721, 722, 723, and 724 respectively, on consecutive transitions of Rx Clock. The length of each shift register must be sufficient to capture all consecutive receive unit intervals comprising one EHBM transfer; thus, in this particular embodiment a depth of five bits is sufficient.

Figure 8:
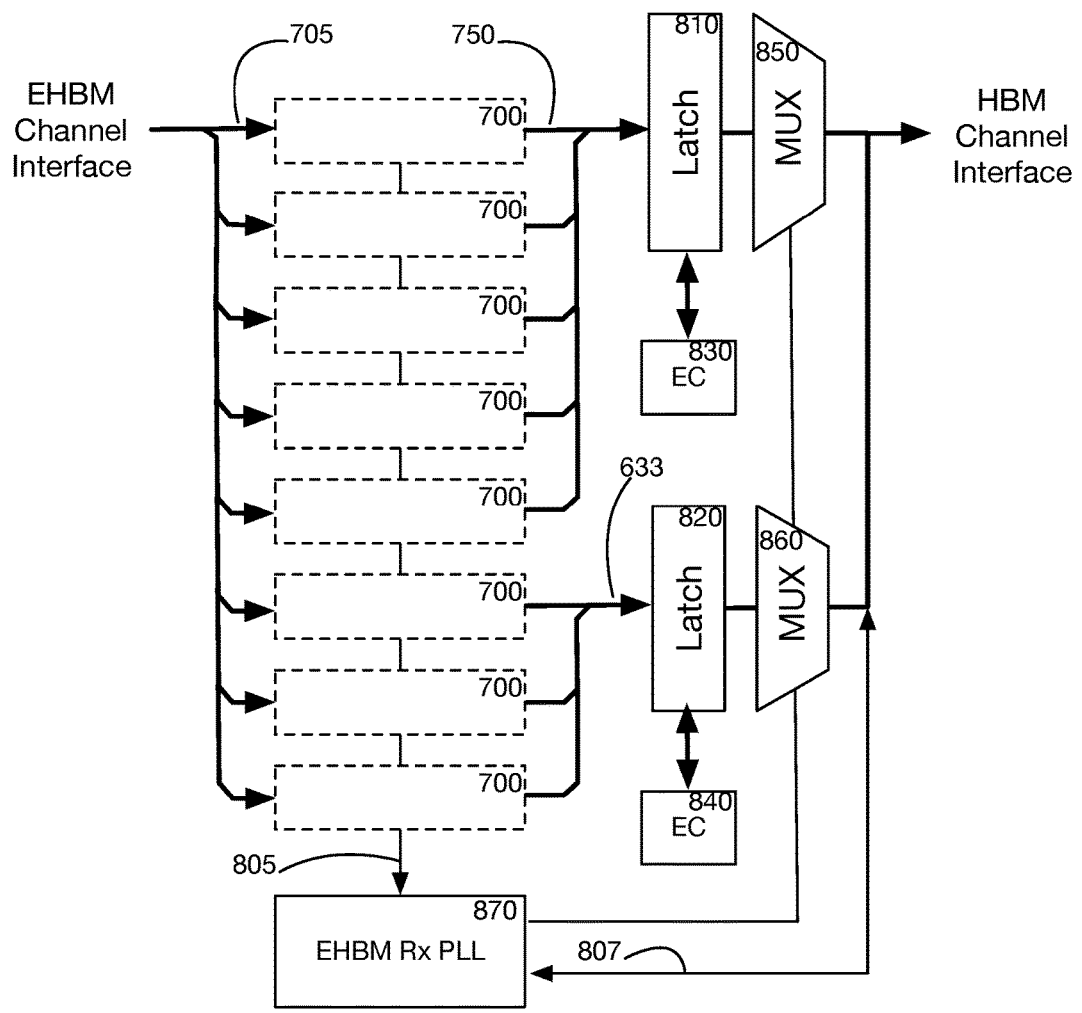
FIG. 8 is a block diagram showing the receivers of FIG. 4 utilized in one embodiment of one channel of an EHBM to HBM interface.

FIG. 8 shows eight instances of the CNRZ-5 receiver and skew compensation 700, representing the five CNRZ-5 channels used for data and the three CNRZ-5 channels used for control/status in this first embodiment. Upon receipt of all five consecutive unit intervals representing one transfer, the complete HBM data word is latched 810 to prevent corruption on a subsequent EHBM receive clock transition. Similarly, the complete HBM control/status word is latched 820. Error Check 830 and 840 operations verify the correctness of the latched information and repair any correctable errors in data protected by FEC augmentation. Following known art convention, unrepairable errors are flagged for end-device notification. The verified and/or repaired information is then selected in two phases by multiplexers 850 and 860 for transfer on the HBM Channel Interface. In some embodiments, FEC validation and repair operations are initiated as data with FEC augmentation is received, such pipelined operation reducing latency.

EHBM Rx PLL 870 may operate in several different modes, depending on the direction of transfer and other characteristics of the embodiment. If the EHBM transmitter is a host device (and thus the primary clock source) the Rx Clocks from 700 are used as a clock reference by 870 to synthesize an appropriate HBM transfer clock 807 at $\frac{1}{5}^{th}$ the EHBM Rate and select multiplexers 850 and 860. Conversely, if the HBM transmitter is the controller or host device, HBM transfer clock 807 drives 870 to select multiplexers 850 and 860.

Balanced Throughput EHBM Embodiment

Figure 9:
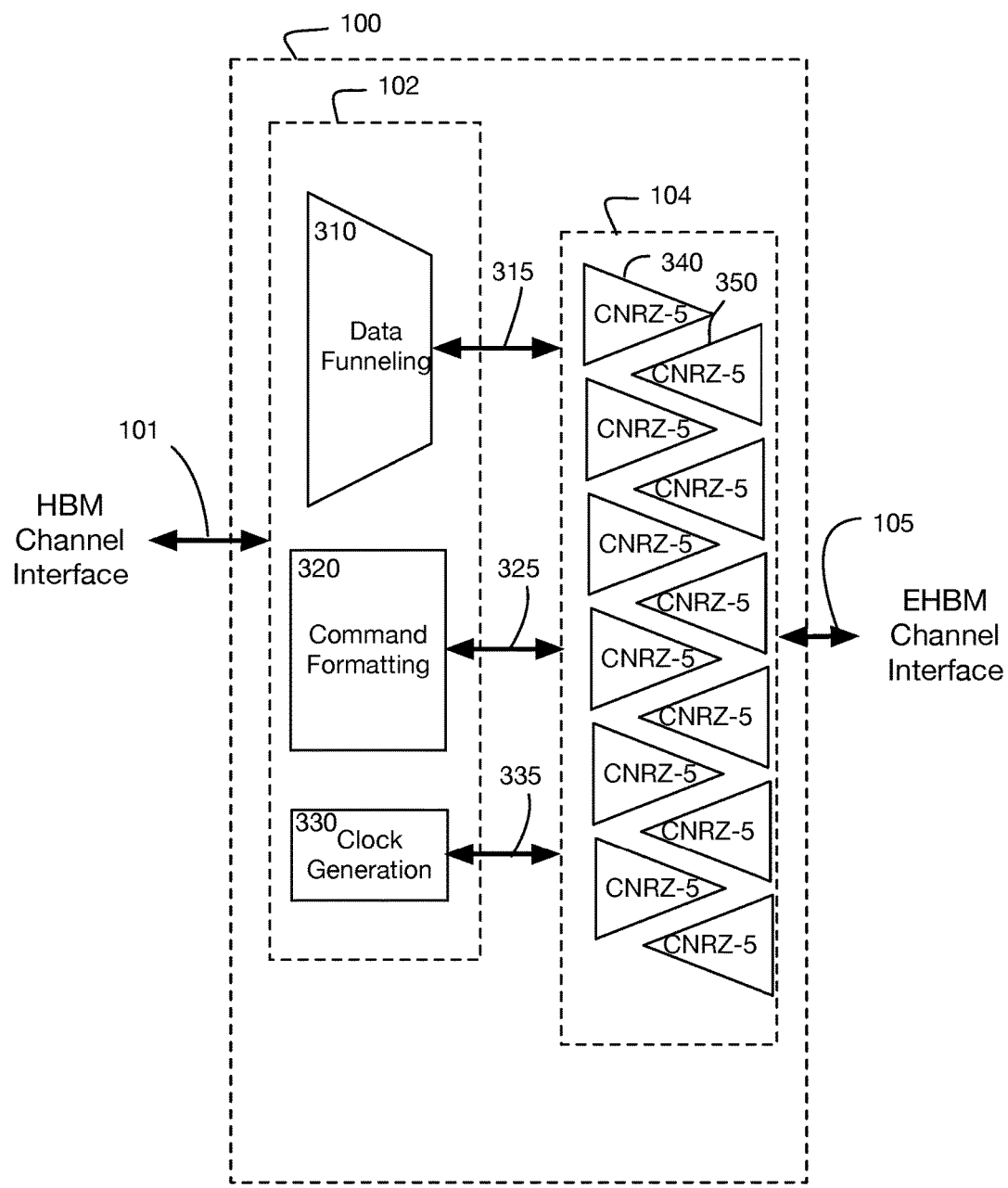
FIG. 9 is a block diagram detailing the internal architecture of a second embodiment of a single channel HBM to EHBM interface as in FIG. 1.

A second embodiment incorporates the same half-duplex individually clocked CNRZ-5 channels as the previous embodiment but as seen in FIG. 9, utilizes only ten CNRZ-5 instances in total (five half duplex instances in each direction, 340 and 350) permitting a reduced wire count but requiring additional clock cycles for each transfer. In this second embodiment, the same data+command/status information as described for the previous embodiment is transferred in eight consecutive CNRZ-5 clocks per HBM transfer. With CNRZ-5 channels operating at 25.6 Gbaud, this embodiment can deliver 51.2 GigaBytes/second over 80 wires, sufficient to support HBM devices operating at up to 3.2 GigaTransfers/second.

The detailed drawings of FIGS. 6, 7, and 8 and the previous descriptions of their operation also apply to this embodiment, with the exception that the EHBM data paths are narrower, and consequently use eight rather than five EHBM transfers to transmit the information in one HBM transfer. Thus, EHBM Tx PLL 622 generates clock 634 at 8× the HBM rate, EHBM Rx deskew shift registers 720 through 724 are at least eight bits in length, there are only five instances of 700 in FIG. 8, and EHBM Rx PLL 870 generates a HBM clock at ⅛ the EHBM rate.

Reduced Wire Count EHBM Embodiment

Figure 10:
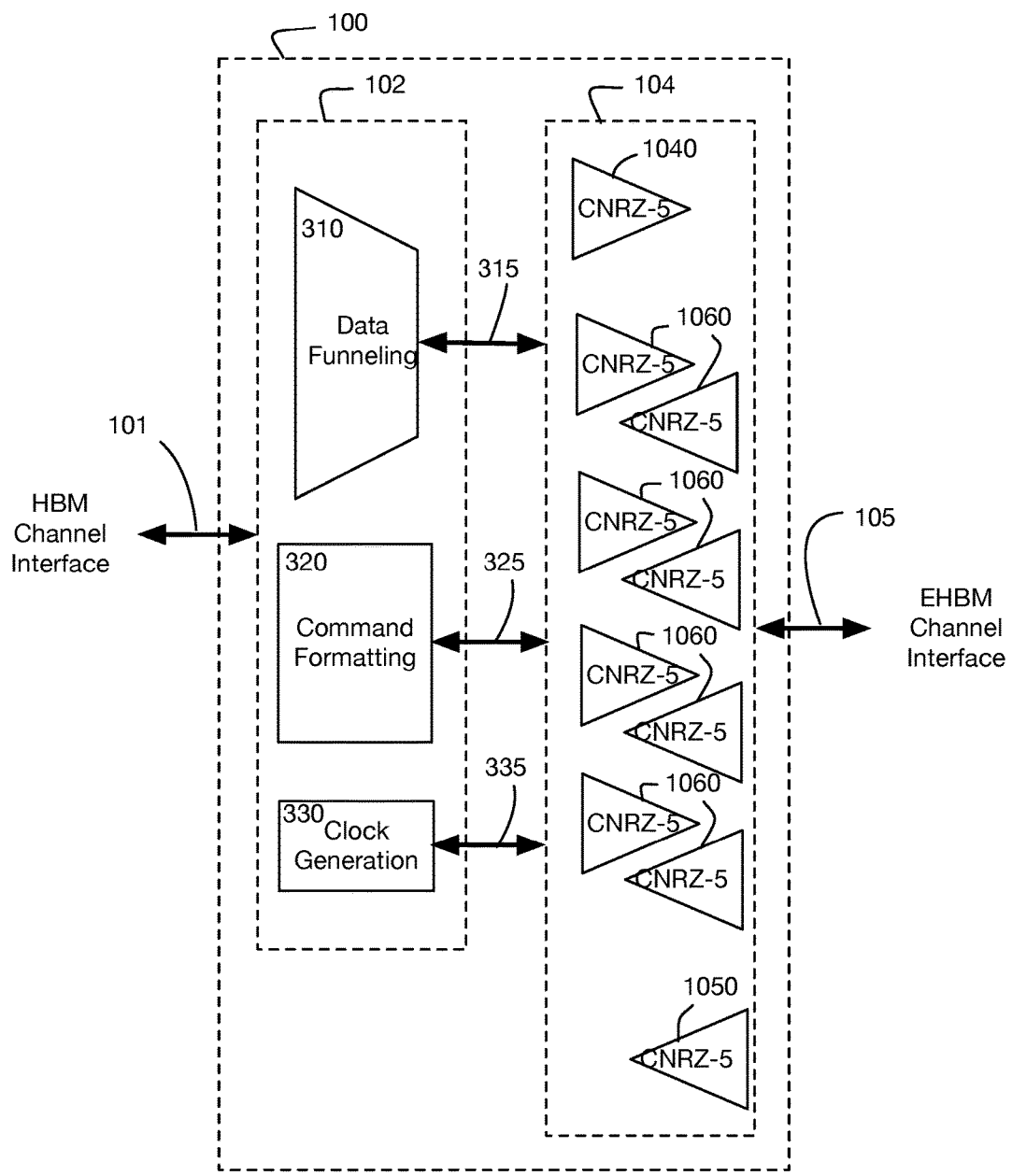
FIG. 10 is a block diagram detailing the internal architecture of a third embodiment of a single channel HBM to EHBM interface as in FIG. 1.

The third embodiment utilizes the same data and control path widths and eight clock transfer cycle as the second embodiment, with a reduced pin count transport requiring only 40 wires and six CNRZ-5 instances. As shown in FIG. 10, one CNRZ-5 instance 1040 is dedicated to operation in the host to memory direction, one CNRZ-5 instance 1050 is dedicated to operation in the memory to host direction, and four CNRZ-5 instances capable of bidirectional operation 1060 are assigned to either host to memory or memory to host operation for the duration of the eight cycle transfer. In at least one embodiment, the half-duplex CNRZ-5 instances are comprised of full duplex CNRZ-5 instances with the unutilized transmitter or receiver instance disabled, permitting a standardized CNRZ-5 design to be iterated across all instances.

In this embodiment, a single clock is used for all CNRZ-5 channels, carried by dedicated differential pairs in each direction, providing a significant reduction in wire count. However, this global clocking comes at the cost of increased potential for skew across CNRZ-5 instances and thus increased need for skew compensation FIFO buffering as previously described. The additional loading on the duplex transfer wires from the additional transmitter and receiver instances, and the turn-around time to switch the direction of the duplex transmission between transfers may result in a reduction of EHBM transfer clock rate. In one embodiment, the CNRZ-5 instances are clocked at 16 Gbaud, sufficient to support a HBM rate of 2 GTransfers/second.

The detailed drawings of FIGS. 6, 7, and 8 and the previous descriptions of their operation also apply to this embodiment; as with the second embodiment described previously, the EHBM data paths in this third embodiment are narrower, and consequently use eight rather than five EHBM transfers to transmit the information in one HBM transfer. Thus, EHBM Tx PLL 622 generates clock 634 at 8× the HBM rate, EHBM Rx deskew shift registers 720 through 724 are at least eight bits in length, there are only five instances of 700 in FIG. 8, and EHBM Rx PLL 870 generates a HBM clock at ⅛ the EHBM rate.

Details of Transmission

The following descriptions may be applied to the previously presented embodiment examples. Where specific EHBM transfer widths and numbers of transfer cycles are described, that information is directly applicable to the second and third embodiments (i.e. those utilizing an eight UI transfer cycle) and may be interpreted by an informed practitioner to indirectly apply to the first embodiment. Similarly, where transport of particular subsets of information across particular CNRZ-5 interfaces is described, that information is directly applicable to the third embodiment and may be interpreted so as to apply to other embodiments.

For purposes of illustration and without implying limitation, an example system environment is assumed in which an embodiment provides EHBM interconnection between a host or controller device and at least one HBM DRAM stack.

In the following example, the host- or controller-facing interface (HEI) of the device translating to EHBM implements a DFI interface. It will be obvious to one familiar with the art that equivalent functionality may be obtained from host devices providing native HBM interfaces, using a host-facing HBM interface on the EHBM translating device.

Similarly, in this example the memory-facing interface (BEI) of the device translating from EHBM implements a HBM interface, which in present practice will typically control an immediately adjacent known art HBM DRAM stack; this configuration may be referred to herein as a "retimer" memory configuration. When DRAM stacks incorporating native EHBM interfaces are available, as one example embodied in a logic-process DRAM stack base chip, a direct interface may be made from the EHBM transport and such DRAM stack. The translation behavior of such a base chip between EHBM and stacked HBM TSV DRAM devices is also as described herein. Other embodiments are possible in which the translation behavior of such a base chip may be from EHBM to a proprietary TSV DRAM interconnection, description of which is beyond the scope of this document but the general concepts of which can be understood given the descriptions herein.

As described in [JEDEC HBM], a single HBM channel is composed of Data DQ[127:0], Column Command/Address C[7:0], Row Command/Address [R[5:0], 16 DBI bits, 16 DM bits, 4 Parity bits, 4 DERR bits, 16 strobes, clocks CK_t and CK_c, CKE, AERR, 8 Redundant Data [RD7:0], Redundant row RR, and Redundant Column RC. There are also low speed signals including five global signals associated with DRAM temperature reporting and 15 IEEE1500 test port signals associated with the full HBM interface, which are neither translated nor transported by EHBM.

EHBM augments the 128 bits of data obtained from HBM with 16 bits of Forward Error Correcting (FEC) code. Along with the 16 DM bits, the resulting transported data payload is 160 bits, structured as two sets of eight ten-bit words, the two sets sent consecutively across two CNRZ-5 interfaces in eight unit intervals.

The values communicated by the CNRZ-5 PHYs are herein identified as SC(24:0) with bit 0 of each individual CNRZ-5 PHYs on SC(20), SC(15), SC(10), SC(5), and SC(0). In some embodiments, SC(24:20) are half duplex, while alternative embodiments may utilize other portions for half-duplex operation. A full description of the format utilized for each CNRZ-5 channel or bit in each EHBM frame are shown in Tables I, II, and III of FIG. 11.

The host to memory control/status portion are sent on SC(24:20) as:
- TPAT—Training PATtern frame—1
- AEXT—Address EXTension—6
- R—Row address—6
- C—Column address—8
- PAR—PARity—4
- EN—ENable indications—4
- CST—Control STate indication—2
- HM_CFEC—Host to Memory Control bus Forward Error Correction—7
- CKE—ClocK Enable—1
- RFU—Reserved for Future Use—1
- Total=40=5 bits×8 clocks The memory to host control/status portion are sent on SC(24:20) as:
- TPAT—Training PATtern frame—1
- AEXT—Address EXTension—6
- AERR—Address ERRor—1
- DERR—Data ERRor—4
- PAR—PARity—4
- EN—ENable indications—2
- CST—Control STate indication—2
- MH_CFEC—Memory to Host Control bus Forward Error Correction—7
- RFU—Reserved for Future Use—13
- Total=40=5 bits×8 clocks Power Management and Framing In at least one embodiment, clock speed is used to put the EHBM subsystem, and optionally attached DRAMs, into a low power mode. The host internally knows when it wants to be in a low power mode. It sends a low-speed signal CKE signal in the host-to-memory direction. The HBM to EHBM translating device samples CKE and uses that to transition out into and out of a low power mode. When the forwarded clock is disabled in the host end of the link, the host passively pulls the wires on the link to a known state. When the reverse direction forwarded clock is disabled in the memory end of the link, the HBM to EHBM translator passively pulls the wires on the link to a known state.

Power management and framing are related to each other, so they are described together here. The power management state machines on each side of the EHBM channel communicate with each other end via the overhead bits labeled CST. For a receiver, these values are only valid when the link is in frame. Transmitters are defined to send various CST values during various states Control STate indication (CST)

The Control STate indication field is carried on two EHBM bits. It carries the power management state.

On the phase when SF=1, the CST(1:)0) bits map into CSTV(3:2). On the phase when SF=0, the CST(1:0) bits map into CSTV(1:0).

The following are the encoded values for CSTV in the Host to DRAM direction
- 0000=H_NOOP=Normal Operation
- 0001=HM_CAL=Initial Calibration of the Host-to-DRAM direction
- 0010=MH_CAL=Initial Calibration of the DRAM-to-Host direction
- 0100=RDQS_CAL1=RDQS Calibration on rank #1
- 0101=RDQS_CAL2=RDQS Calibration on rank #2 (reserved—will not be implemented in test chip)
- 0110=HM_PCAL=Periodic calibration of Host-to-DRAM direction
- 0111=MH_PCAL=Periodic calibration of DRAM-to-Host direction
- 1001=CA_DOWN=DFI-directed power down of C/A
- 1010=D_DOWN=DFI-directed power down of data
- 1011=CAD_DOWN=DFI-directed power down of both C/A and data All other values are reserved.

The encoded values of CSTV in the Memory to Host direction are the following:
- 0000=M_NOOP=Normal Operation
- 0001=CAL_ACT=Acknowledge calibration state is active
- 0010=CAL_COMP=Calibration state completed
- 0011=PDS_ACT=Acknowledge power down state is active
- 0101=ERR_TRANS=Error: Incoming signal is not transitioning
- 0110=ERR_SF=Error: SF bits indicate framing lost
- 1001=CA_FECE=Warning: FEC error on Host-to-DRAM C/A fixed
- 1010=DH_FECE=Warning: FEC error on DQ[127:64] fixed
- 1011=DL_FECE=Warning: FEC error on DQ[63:0] fixed All other values are reserved.

Training Pattern

The goal of training is to allow each receiver to align itself to the data. The training pattern sequence is shown in Table I of FIG. 11.

The framing pattern, F(7:0) is sent as 0b01111000 during training.

TPAT is set to 0b1 in training frames. The purpose of TPAT is to allow the receiver to unambiguously distinguish between training frames and regular frames.

On SC(15:0) the pattern 0x5A5A is sent on clocks 0, 2, 4 and 6. The pattern 0xA5A5 is sent on clocks 1, 3, 5 and 7. Notwithstanding the above, FEC is sent as normal and is sent as defined above.

The training pattern of Table I is used in both directions. The SF, CST and FEC bits are sent as normal. The HEI and BEI cooperate to train and calibrate the line using the commands defined on the CST field Host-to-Memory Multiplexing Structure The EHBM interface has twenty-five sub-channels, numbered SC(24:0). Table II of FIG. 11 shows the frame format for messages in the host-to-memory direction, with Column 1 showing the consecutive unit interval of the frame, the sub-channels SC(24:20) that carry the control/status information shown in the columns labeled 24 to 20, and sub-channels that carry the data and data-related signals shown in the columns labeled 19 to 0. RFU is defined as: set to 0 and Reserved for Future Use.

Memory-to-Host Multiplexing Structure

Table III of FIG. 11 shows the frame format for messages in the memory-to-host direction, with Column 1 showing the consecutive unit interval of the frame, the sub-channels SC(24:20) that carry the control/status information shown in the columns labeled 24 to 20, and the sub-channels that carry the data and data-related signals shown in the columns labeled 19 to 0.

Address EXTension (AEXT)

AEXT(5:0) is used in future applications to select the HBM stack to be addressed. These bits are not needed when only one HBM stack is being supported and should be set to 0x000000.

In memory extension applications, each HBM stack must have its own address corresponding to an AEXT codeword.

In applications that support HBM Channel Multiplexing (described below), AEXT(0) is used to select between the two multiplexed HBM channels.

The means by which the HBM stack addresses are strapped or configured is determined by the configuration or construction of the specific embodiment.

The AEXT field is not strictly needed in the memory to host direction since the host knows the read latency of the HBM stacks. However, AEXT is sent here to improve the robustness of the interface.

An optional EHBM feature is to add AEXT_2CYCLE_CAP and AEXT_2CYCLE_CONFIG capability and configuration bits. When an interface is able to support the AEXT_2CYCLE mode, it asserts the AEXT_2CYCLE_CAP bit. If all necessary devices can support the AEXT_2CYCLE capability, then the host is free to configure the devices with AEXT_2CYCLE_CONFIG asserted.

When AEXT_2CYCLE_CONFIG is asserted, AEXT(5:0) carries the AEXT(11:6) values when SF(0) is 0x0 and the AEXT(5:0) values when SF(0) is 0b1. This allows the AEXT(5:0) frame multiplexer bits to convey twice as many AEXT bits. This is similar to what is done by HBM with the R and C fields. This allows the AEXT depth to have 6 more bits at the cost of latency and to address many EHBM devices.

HBM Data PARity (PAR) and DBI Parity (DBIPAR)

PAR(3:0) are the raw HBM PAR(3:0) bits. They provide an end-to-end error protection signal through the concatenation of server link, any switching that may occur, and the HBM link between the far end HBM base layer and the memory devices. These must be carried over the control/status channels since they can be configured in the HBM registers to arrive later than the data that they carry the parity data for.

Data Bus Inversion offers no benefit within the CNRZ-5 transport used by EHBM. Thus, if DBI is enabled over HBM it will be transparently regenerated at the remote EHBM-to-HBM interface. The insertion of DBI on the memory side of the link (see below) adds a complication to PAR. EHBM uses a distributed PAR generation as follows:

On writes, the BEI computes the parity of the DBI bits (if enabled), and drives this over DBIPAR on the unary channel. The DBI from the memory controller is discarded, and is recalculated in the BEI. The BEI also calculates the parity value of the recalculated DBI bits, and adds this to the received DBIPAR value. The result is delayed based on parity latency, and then is added to the write data PAR bits.

On reads, the BEI computes the parity of the DBI bits (if enabled), and drives this over DBIPAR on the unary channel. The BEI delays DBIPAR based on parity latency and adds this value to the read data PAR bits. The DBI from the DRAM is discarded in the BEI; DBI bits to the memory controller are tied to zero.

If the post-Hamming correction EHBM parity is still has a single bit error in either direction, then the final sum in that direction will also be corrupted, so the PAR will be incorrectly computed.

Data (D)

D(127:0) are the raw HBM data bits. In pseudo-channel mode, these are split into D(127:64) and D(63:0).

Data Mask Check Bit (DM_CB)

DM_CB(15:0) are the raw HBM data mask/check bit bits. As per the HBM specification, these bits can be configured to carry either data mask or ECC information for the memory.

Row and Column Addresses (R, C)

The meaning of each these are defined as per the HBM specification. The SF bit takes the place of the CK signal in determining the meaning of these bits in successive eight unit-interval frames.

HBM Redundant Wires (RD, RC, RR)

The service point for the HBM redundancy signals is directly at the HBM interface. The HBM configuration mechanism is operated at that point, so the redundant wires are not carried over the link. This applies to the HBM RD(7:0), RC and RR signals. The EHBM overhead link, delivered by the OH bit in the EHBM packet is the obvious path to deliver this configuration information. However, the specific mechanism is out of the scope of this document.

HBM DBI Line Code (DBI)

The service point for the HBM DBI (Data Bus Inversion) line code is at the HBM interface. In the HBM egress direction if enabled, the DBI bus transformation is computed there and not carried over the EHBM link. The HBM data bits may be inverted relative to the EHBM bits. In the HBM ingress direction, the DBI line code is interpreted & removed and is not carried over the EHBM link. This applies to the HBM DBI(15:0) signals.

Enables (EN)

The EN bits (host to DRAM) transmit the dfi_wrdata_en[3:0] (when SF=1) and dfi_rddata_en[3:0] signals (when SF=0). Note these are SDR signals, so the eight signals fit on the existing four bits.

The EN bits (DRAM to host) are used to send the dfi_rddata_en[3:0] bits back after they are retimed and aligned with the DRAM data. This is SDR, so RD[1:0] carries dfi_rddata_en[3:2] when SF=1, and dfi_rddata_en[1:0] when SF=0.

ClocK Enable (CKE)

The CKE bit carries the clock enable signal from the HEI memory controller to the memory.

Error Control

High bit rate PHYs, in the absence of over-engineering, typically operate with very low but measureable error rates. In order to support server availability goals, error control is likely to be necessary in certain situations.

The use of retry-on-error is inappropriate on these sorts of links given the sequential nature of the HBM interface as well as most other traditional memory interfaces. Most of the activity on the HBM bus is organized in multi-clock sequences that cannot be conveniently stopped and retried without a significant rewrite of the HBM specification. Forward Error Correction (FEC) is a highly appropriate alternative. Even simple FEC can raise the mean time to failure to sufficient levels.

Either the memory subsystem or the memory itself is assumed to have its own error control mechanism. The EHBM error control mechanism is only designed to control errors on the EHBM link and not in the memory itself.

HBM has only an error detection mechanism on the address information, which has no recovery mechanism specified. The memory controller may execute a "checkstop" routine to attempt to recover from the failure. EHBM's FEC will help the robustness of the carriage of HBM's address information.

This error correcting code is of very low compute complexity to allow low latency on-the-fly computation.

Because EHBM is a memory link, the EHBM is engineered to have a very low error ratio before the FEC is applied. The operation of the FEC is to lower the error ratio further to levels that are compatible with the system of interest. An example pair of error ratios that a system designer might employ could be 1×10E-14 before the FEC and 1×10E-18 after the operation of the FEC.

Data Bus Error Control

The data bus calculates an error correcting (80, 72) code over each of the unidirectional command/address and data paths creating even parity.

FEC(7:0) is the error correction field associated with each group of five subchannels (one CNRZ-5 instance). The input the to this field, DCheckSeqIn(255:0) is prepared as follows for the 5 subchannels of each CNRZ-5 instance across 16 consecutive frames. This pattern has been chosen for the ease of implementation.

DCheckSeqIn(223) SC4 in frame 4
DCheckSeqIn(207) SC4 in frame 5
DCheckSeqIn(195) SC4 in frame 6
DCheckSeqIn(193:191) SC4 in frames 7, 12, and 13
DCheckSeqIn(175) SC4 in frame 14
DCheckSeqIn(167) SC4 in frame 15
DCheckSeqIn(163) SC3 in frame 0
DCheckSeqIn(161:159) SC3 in frames 1, 2, and 3
DCheckSeqIn(151) SC3 in frame 4
DCheckSeqIn(145) SC3 in frame 5
DCheckSeqIn(143) SC3 in frame 6
DCheckSeqIn(137:135) SC3 in frames 7, 8, and 9
DCheckSeqIn(133:128) SC3 in frames 10, 11, 12, 13, 14, 15
DCheckSeqIn(111) SC2 in frame 0
DCheckSeqIn(103) SC2 in frame 1
DCheckSeqIn(97:95) SC2 in frames 2, 3, and 4
DCheckSeqIn(87) SC2 in frame 5
DCheckSeqIn(83) SC2 in frame 6
DCheckSeqIn(80:79) SC2 in frames 7, and 8
DCheckSeqIn(75) SC2 in frame 9
DCheckSeqIn(72:71) SC2 in frames 10, and 11
DCheckSeqIn(68:64) SC2 in frames 12, 13, 14, 15, and SC1 in frame 0
DCheckSeqIn(55) SC1 in frame 1
DCheckSeqIn(51) SC1 in frame 2
DCheckSeqIn(48:47) SC1 in frames 3, and 4
DCheckSeqIn(43) SC1 in frame 5
DCheckSeqIn(41) SC1 in frame 6
DCheckSeqIn(39) SC1 in frame 7
DCheckSeqIn(37:35) SC1 in frames 8, 9, and 10
DCheckSeqIn(33:32) SC1 in frames 11 and 12
DCheckSeqIn(27) SC1 in frame 13
DCheckSeqIn(25) SC1 in frame 14
DCheckSeqIn(23) SC1 in frame 15
DCheckSeqIn(21:16) SC0 in frames 0, 1, 2, 3, 4, and 5
DCheckSeqIn(13:8) SC0 in frames 6, 7, 8, 9, 10, and 11
DCheckSeqIn(6:4) SC0 in frames 12, 13, and 14
DCheckSeqIn(2) SC0 in frame 15
Bits not listed above are all zeros.

The equivalent calculation is performed for each group of five subchannels of the command/address and data busses.

HBM itself has two mutually exclusive modes for the 16 DM_CB bits, DM mode and ECC mode.

When HBM's DM mode is enabled, the DM_CB bits carry byte mask information and there is no error control. EHBM does not add any additional error control to the data bus.

When HBM's ECC mode is enabled, the DM_CB bits carry user-defined check-bit information that deliver user-defined error control for each pseudo-channel. EHBM does not add any additional error control to the data bus.

Super-Frame (SF)

In the HEI to BEI direction, the HEI generates an alternating 0b1, 0b0 pattern on SF. This allows interpretation of the R, C and EN values, which have different meanings on each phase on successive 8 unit-interval frames.

In the BEI to HEI direction, the BEI generates an alternating 0b1, 0b0 pattern on SF synchronized to the CK signal on the HBM interface. This allows interpretation of the EN, DERR and AERR values, which have different meanings on each phase on successive 8 unit-interval frames.

EHBM Line Coding

The combination of the CFEC fields ensure that a minimum number of transitions are present on the unidirectional links sufficient to allow the clock alignment function to occur. No scrambling or other similar line code is applied. As a result, the line code is not DC balanced on any given wire SC(24:0), although the six-wire sets used by each CNRZ-5 channel are collectively balanced as a group.

On the control/status channels, one transition is guaranteed per 8 clocks due to the operation of the FEC.

On the data channels, one transition is guaranteed per 8 clocks due to the operation of the FEC.

It is acceptable to train to a training pattern and then do periodic retraining.

Clocking

The EHBM interface uses a clock forwarded architecture. An 8 GHz differential DDR clock is forwarded along with the data in each direction. These differential clocks are shared by the CNRZ-5 PHYs.

In the HEI, a circuit creates or drives an 8 GHz clock over the line. This clock is high for one unit interval and low for one unit interval.

In the BEI, a phase rotator uses phase centering during training to select the best phase of the 8 GHz clock with which to acquire the received data. The BEI holds this alignment between data bursts. The BEI reselects the best phase during retraining.

The BEI also drives a 8 GHz clock back to the host.

The BEI also drives the 1 GHz DDR clock onto the HBM bus aligned with the HBM data, retaining alignment with the two frame-nature of the information in the R and C fields.

In the HEI, a phase rotator uses phase centering during training to select the best phase of 8 GHz clock with which to acquire the received data. The HEI holds this alignment between data bursts. The HEI reselects the best phase during retraining.

Host to Memory Framing

The goal of framing is to allow the receiver to find and continuously check that it has properly found the start and finish of the multiplexing pattern. It also allows the CNRZ-5 PHYs to be aligned.

During training operation, the host holds the link in the training pattern for long enough for the memory to find the pair of eight unit interval frames. The computation results of the FEC values can be used to check this alignment.

Once the training operation is completed and the training pattern is removed, the memory continuously checks the SF bit and the FEC fields to be sure that frame has not been lost. If frame is lost, the memory should declare so quickly to prevent false operation by gating off memory accesses and retrain the interface. The memory signals back to the host this information via the codewords defined for the CST bit.

The computation of the FEC can also be used to verify the maintenance of the framing. The link is engineered to have a very low error rate before the FEC, so the FEC should have a very low probability of being incorrect. A circuit that tests that for an excessive FEC error ratio can also serve as a framing check.

Memory to Host Framing

During training operation, the memory holds the link in the training pattern for long enough for the host to find the pair of eight unit interval frames. The computation results of the FEC values can also be used check this alignment.

Once the training operation is completed and the training pattern is removed, the host continuously checks the SF bit and the FEC fields to be sure that frame has not been lost. If frame is lost, the host should declare so quickly to prevent false operation and retrain the interface.

The computation of the FEC can also be used to verify the maintenance of the framing. The link is engineered to have a very low error rate before the FEC, so the FEC should have a very low probability of being incorrect. A circuit that tests that for an excessive FEC error ratio can also serve as a framing check.

Example Embodiment

FIGS. 12-23 show block diagrams of one representative implementation of the previously-described third EHBM embodiment, provided for descriptive purposes without implying limitation.

Figure 12:
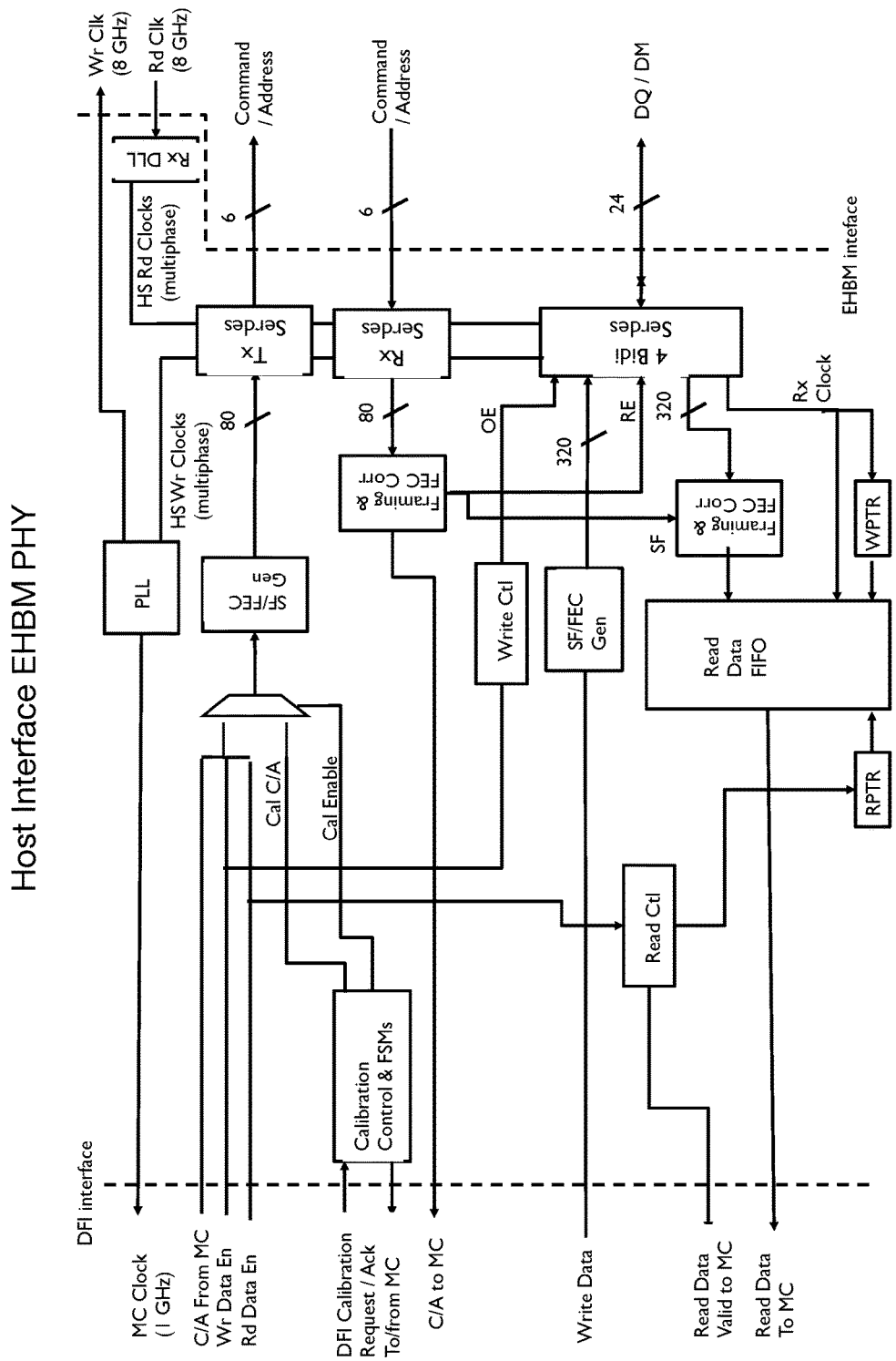
FIG. 12 is a block diagram of one embodiment of a Host Interface EHBM PHY.

FIG. 12 is a block diagram of one embodiment of a Host Interface EHBM PHY.

Figure 13:
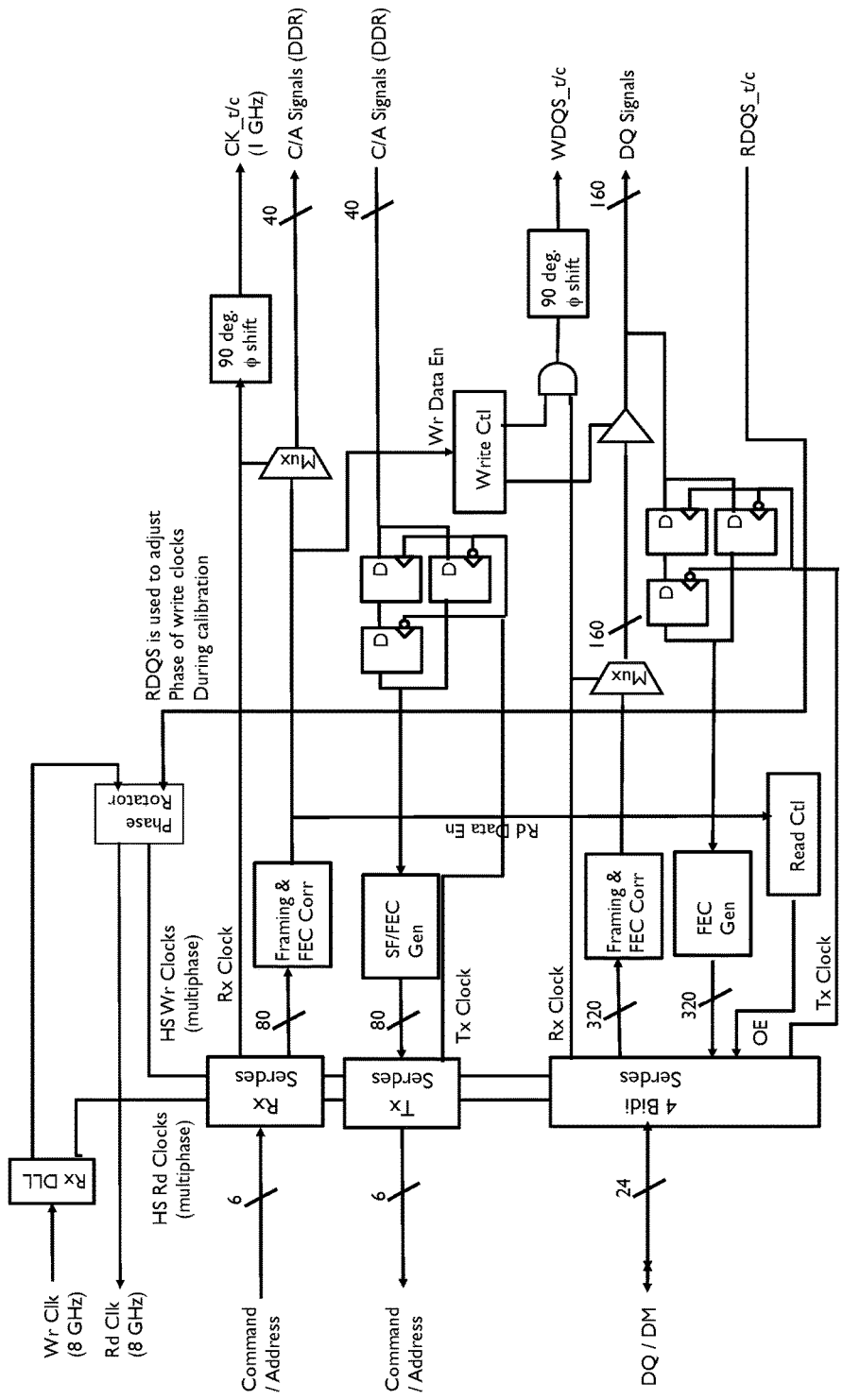
FIG. 13 is a block diagram of one embodiment of a Base Chip EHBM PHY.

FIG. 13 is a block diagram of one embodiment of a Base Chip EHBM PHY.

Figure 14:
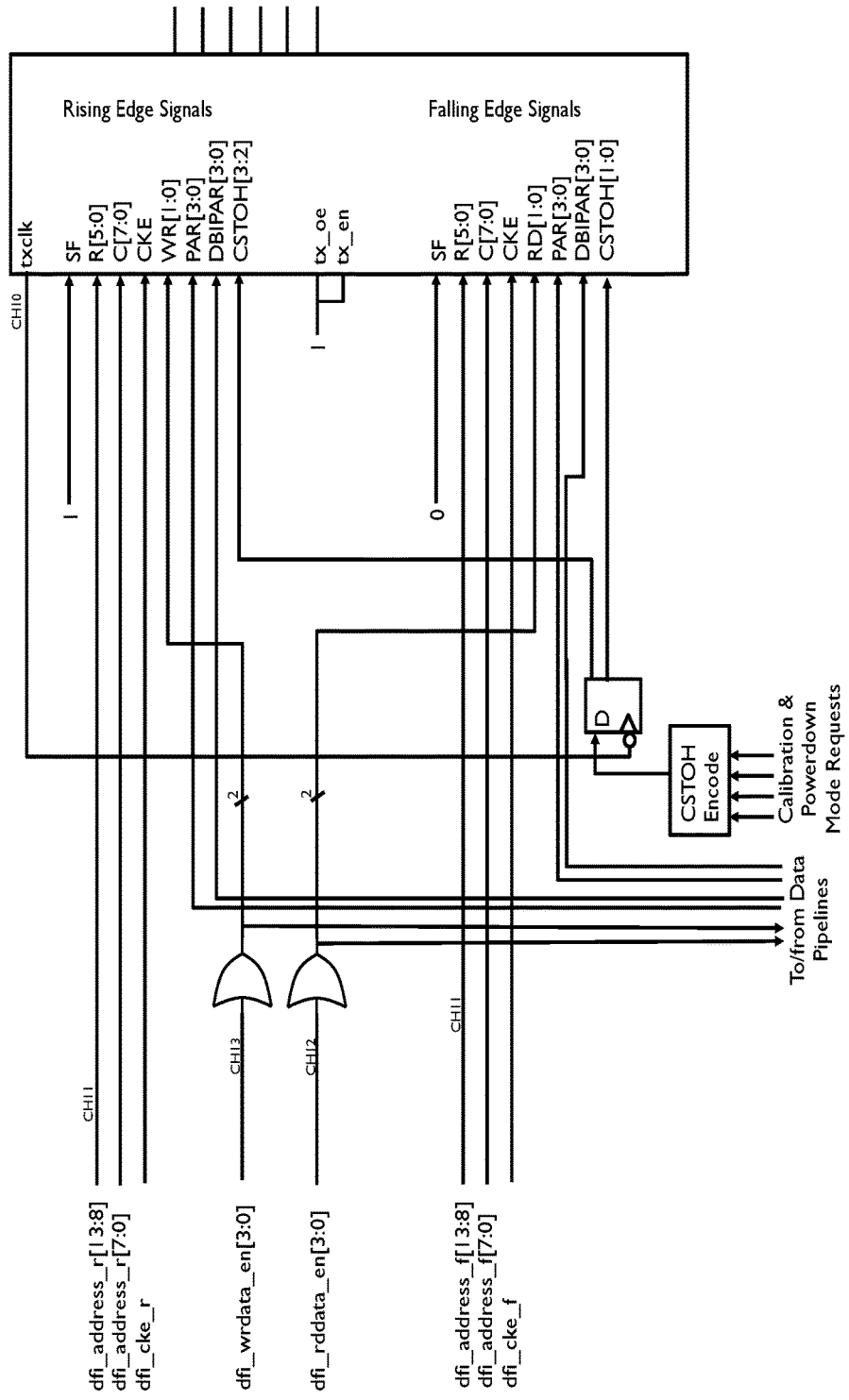
FIG. 14 is a block diagram of one embodiment of the HEI Command/Address pipeline operating in the Host to memory direction.

FIG. 14 is a block diagram of one embodiment of the HEI Command/Address pipeline operating in the Host to memory direction. In this example, all DFI signals are assumed to be synchronous to the MC clock, and FEC generation is internal to the SERDES.

Figure 15:
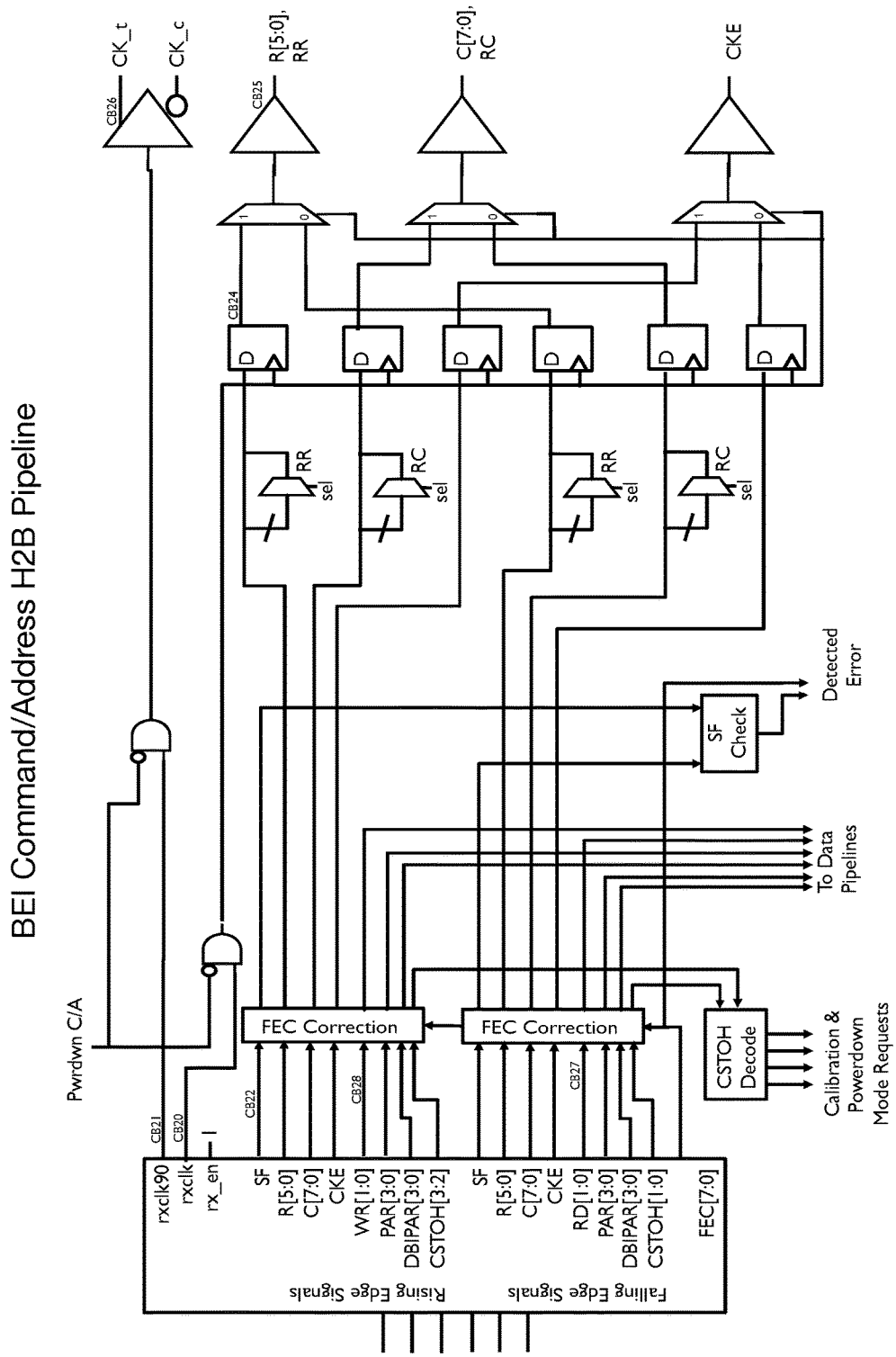
FIG. 15 is a block diagram of one embodiment of the BEI Command/Address pipeline operating in the Host to memory direction.

FIG. 15 is a block diagram of one embodiment of the BEI Command/Address pipeline operating in the Host to memory direction. In this example the FEC check bit is internal to the SERDES, but the correction stage is external.

Figure 16:
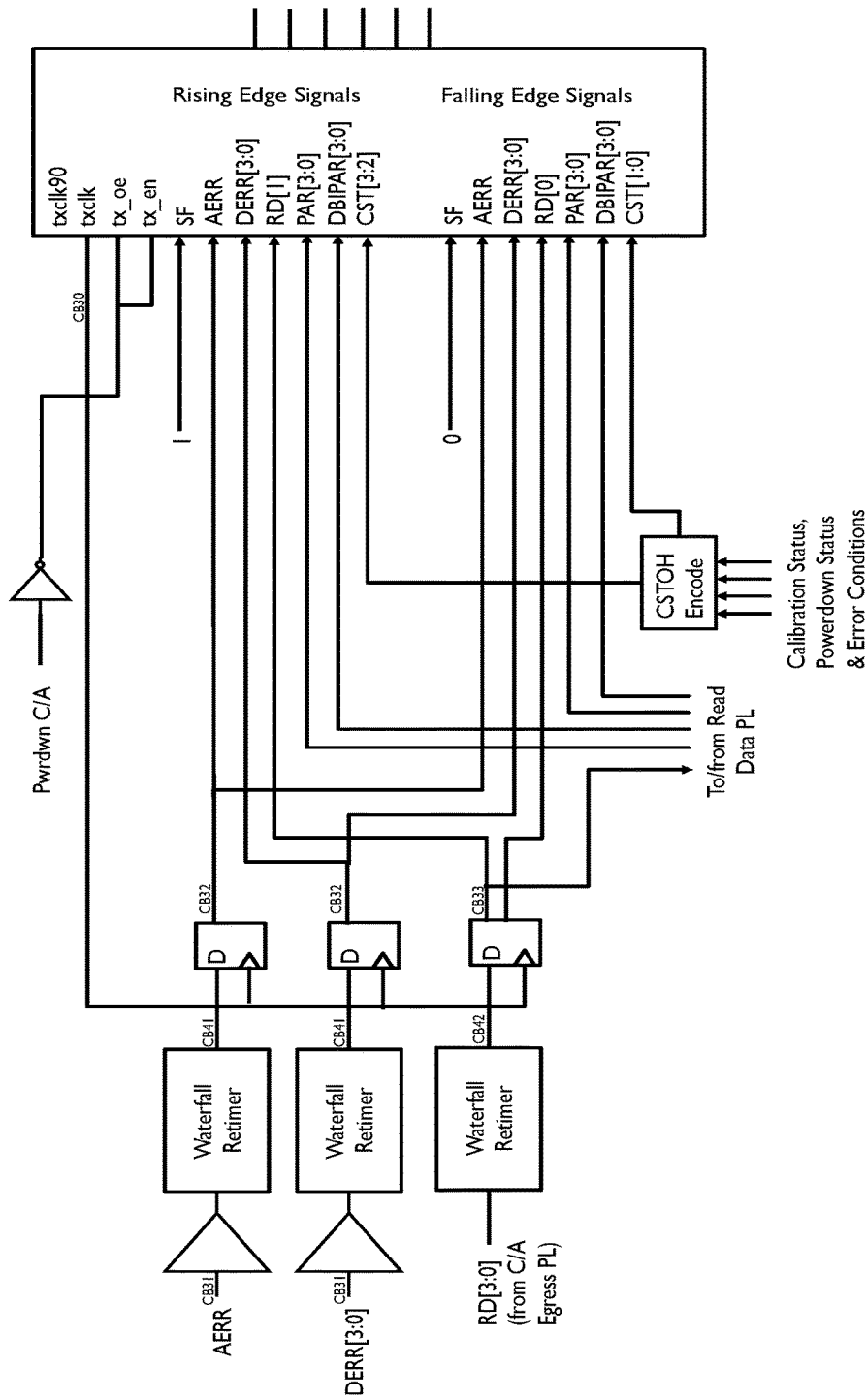
FIG. 16 is a block diagram of one embodiment of the BEI Command/Address pipeline operating in the memory to Host direction.

FIG. 16 is a block diagram of one embodiment of the BEI Command/Address pipeline operating in the memory to Host direction. In this example, FEC generation is internal to the SERDES.

Figure 17:
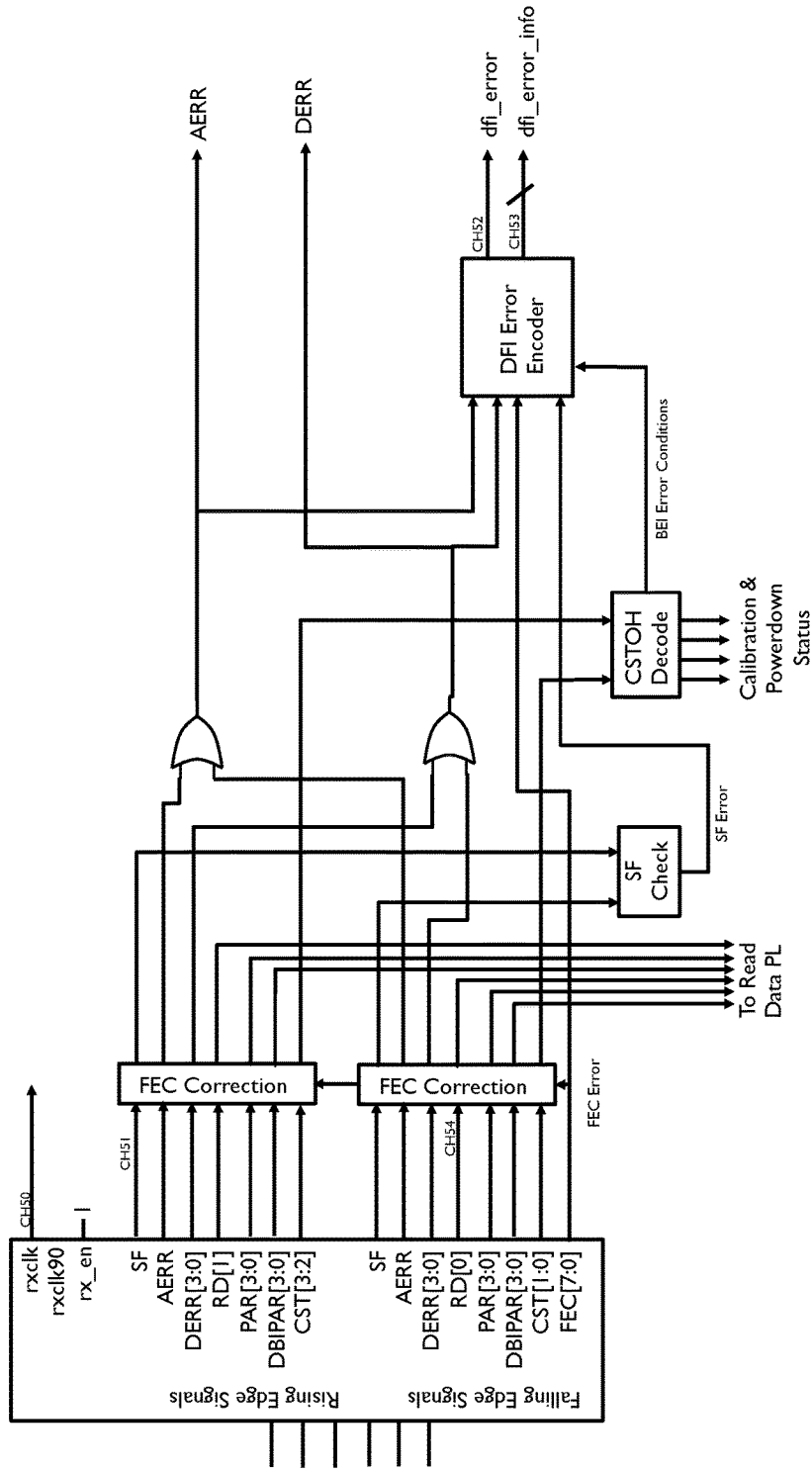
FIG. 17 is a block diagram of one embodiment of the HEI Command/Address pipeline operating in the memory to Host direction.

FIG. 17 is a block diagram of one embodiment of the HEI Command/Address pipeline operating in the memory to Host direction. In this example, all logic is presumed to be in the RxClk domain, FEC check bit generation is internal to the SERDES, FEC correction stage is external, AERR and DERR are in RxClk domain, and DFI outputs are in MC clock domain.

Figure 18:
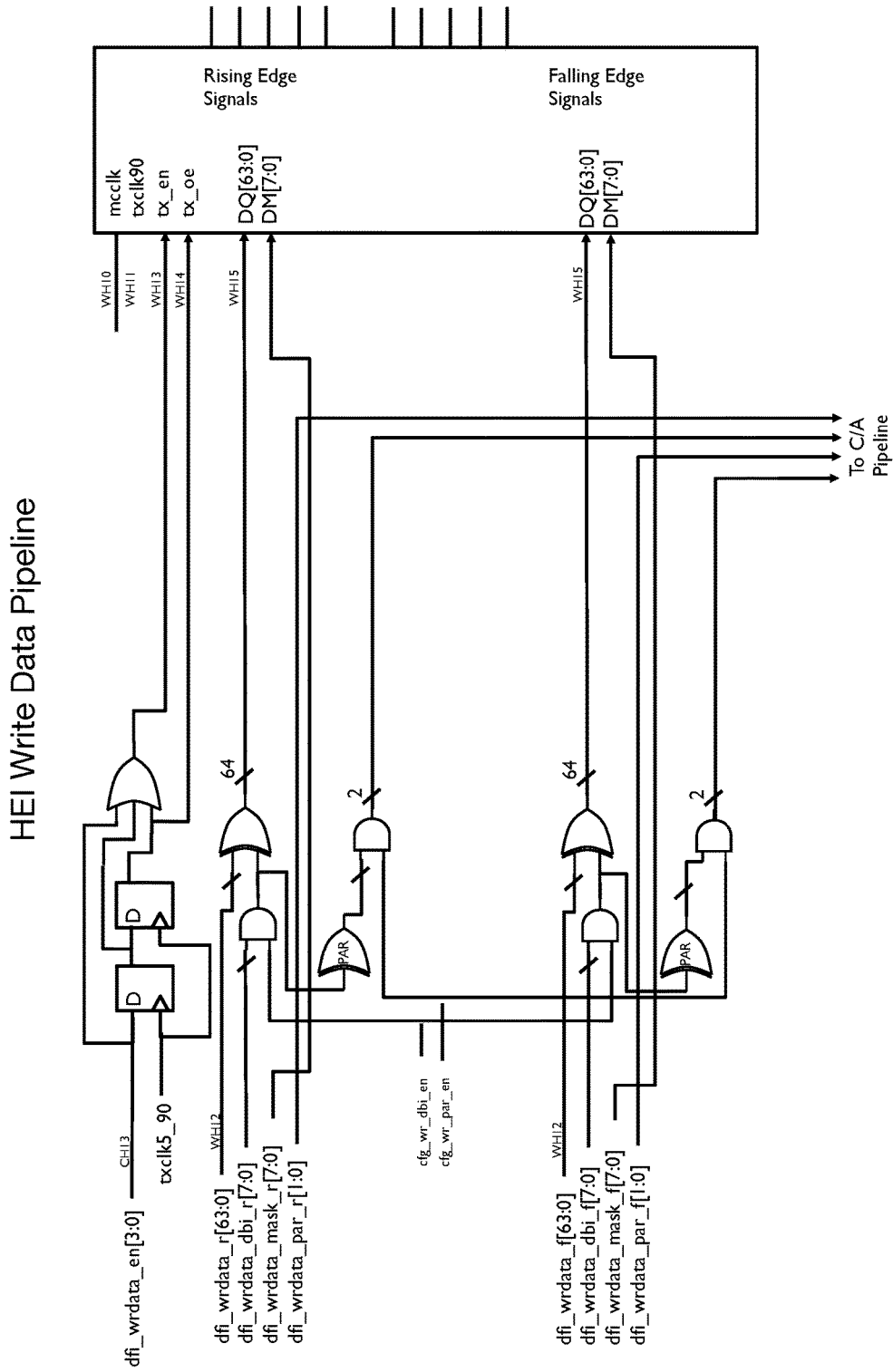
FIG. 18 is a block diagram of one embodiment of the HEI Write data pipeline.

FIG. 18 is a block diagram of one embodiment of the HEI Write data pipeline. This example shows the lower pseudo-channel using 2 SERDES; the upper pseudo-channel is similar. If MC supplies DBI. data inversion is removed and DBI_PAR is carried on the C/A H2B pipeline, with BEI regenerating DBI. PAR is carried on the C/A H2B pipeline. FEC generation is internal to the SERDES.

Figure 19:
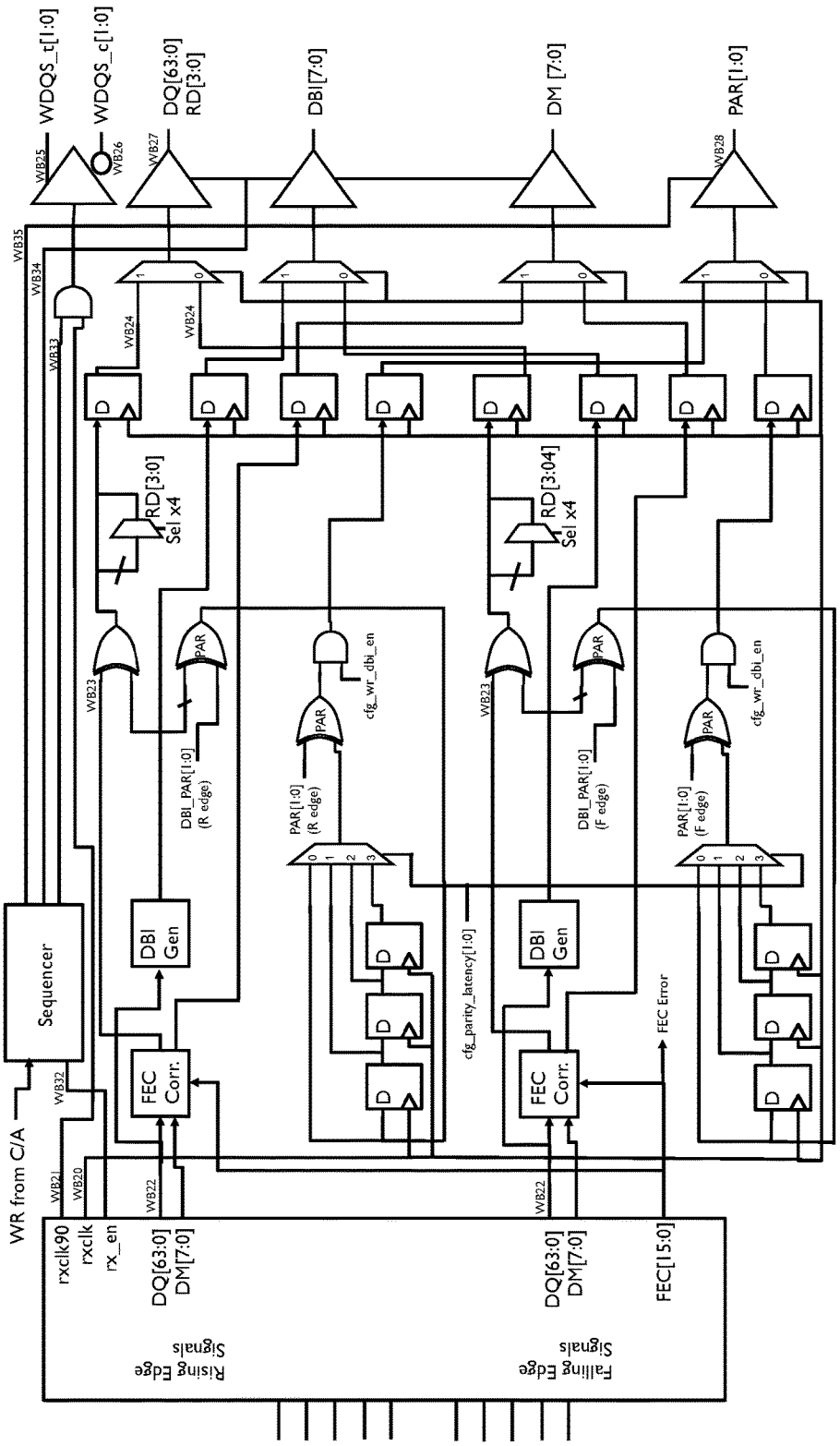
FIG. 19 is a block diagram of one embodiment of the BEI Write data pipeline.

FIG. 19 is a block diagram of one embodiment of the BEI Write data pipeline. This example shows the lower pseudo-channel using 2 SERDES; the upper pseudo-channel is similar. PAR and DBI_PAR are carried on the C/A pipeline; Wr Data pipeline adds DBI. WR[3:0] sequencer input is carried on C/A. FEC check bit generation is internal to the SERDES, correction stage is external.

Figure 20:
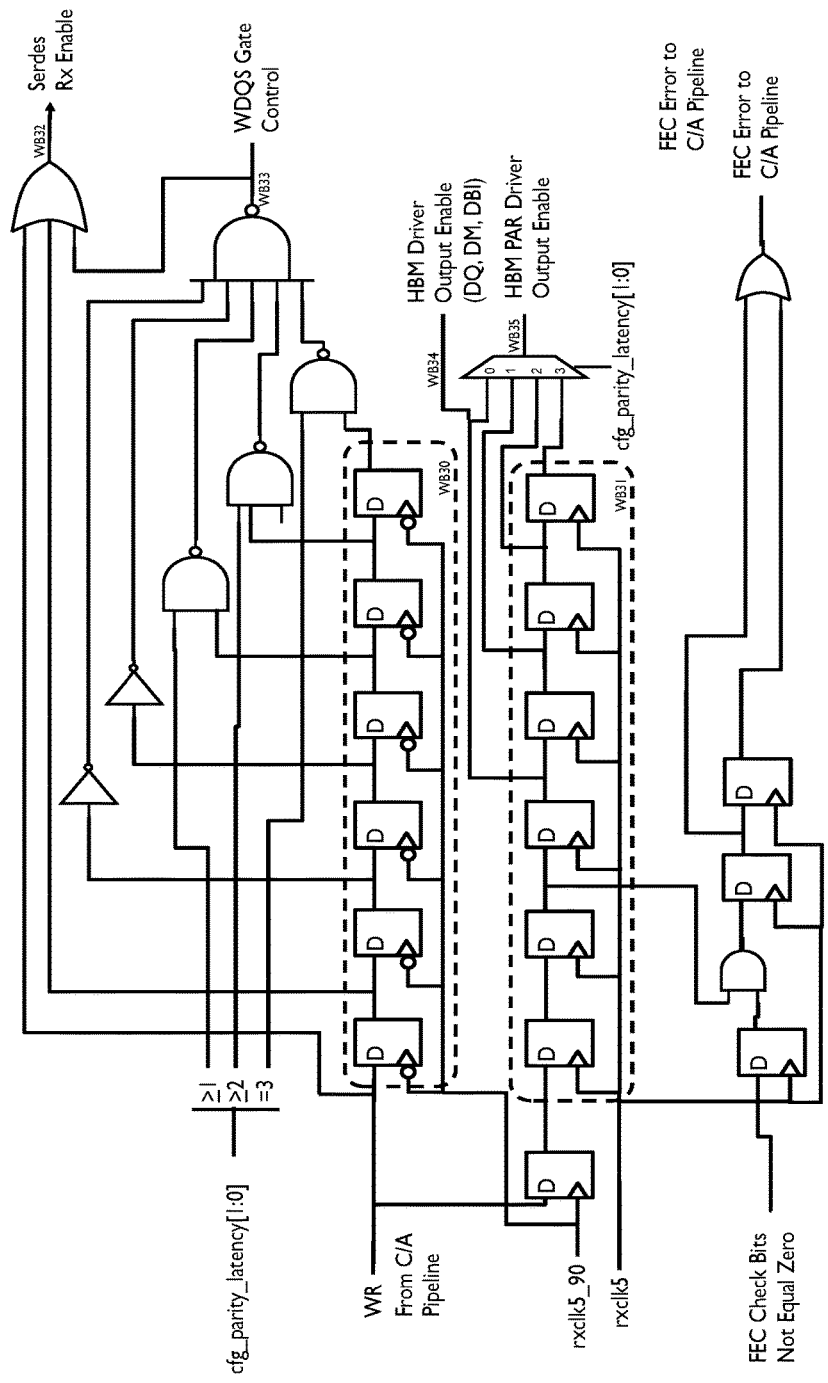
FIG. 20 is a block diagram of one embodiment of the BEI Write data pipeline sequencer.

FIG. 20 is a block diagram of one embodiment of the BEI Write data pipeline sequencer. This example shows logic for one pseudo-channel; other pseudo-channel is similar. FEC error extended for async crossing.

Figure 21:
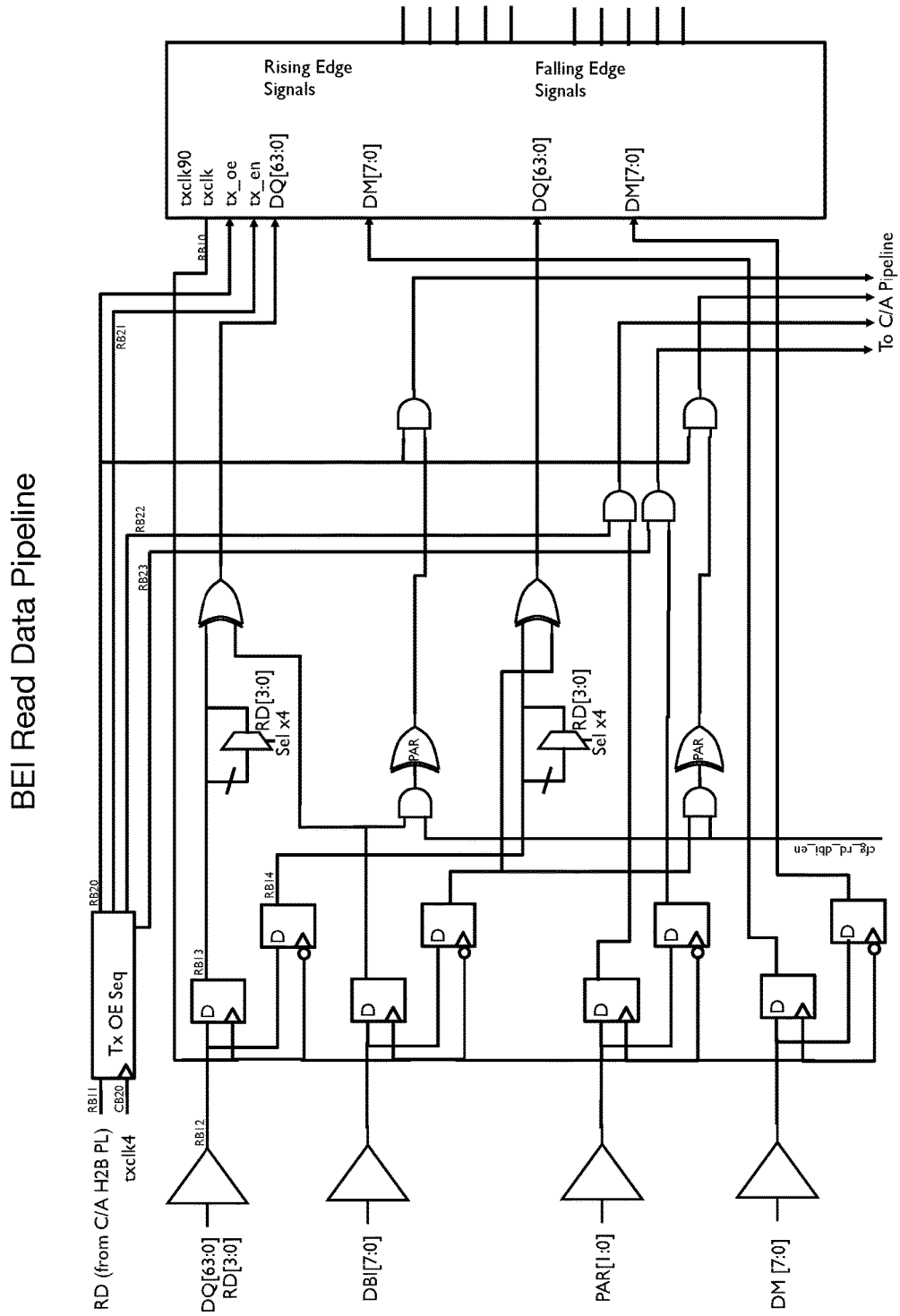
FIG. 21 is a block diagram of one embodiment of the BEI Read data pipeline.

FIG. 21 is a block diagram of one embodiment of the BEI Read data pipeline. This example shows one pseudo-channel using two SERDES. RD. Read_PAR and DBI_PAR connect to/from CA H2B and B2H pipelines. FEC generation is internal to SERDES. RDQS input to SERDES for training is not shown.

Figure 22:
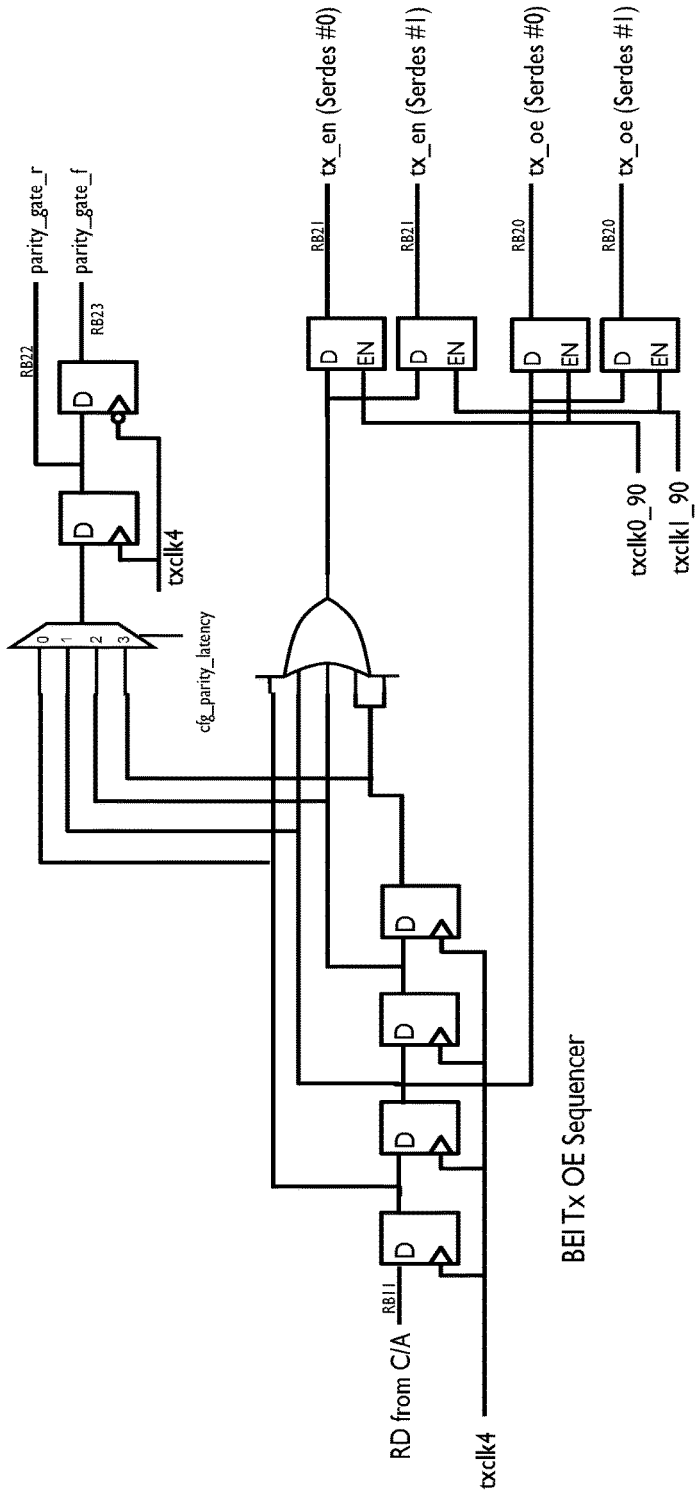
FIG. 22 is a block diagram of one embodiment of the BEI Sequencers.

FIG. 22 is a block diagram of one embodiment of the BEI Sequencers.

Figure 23:
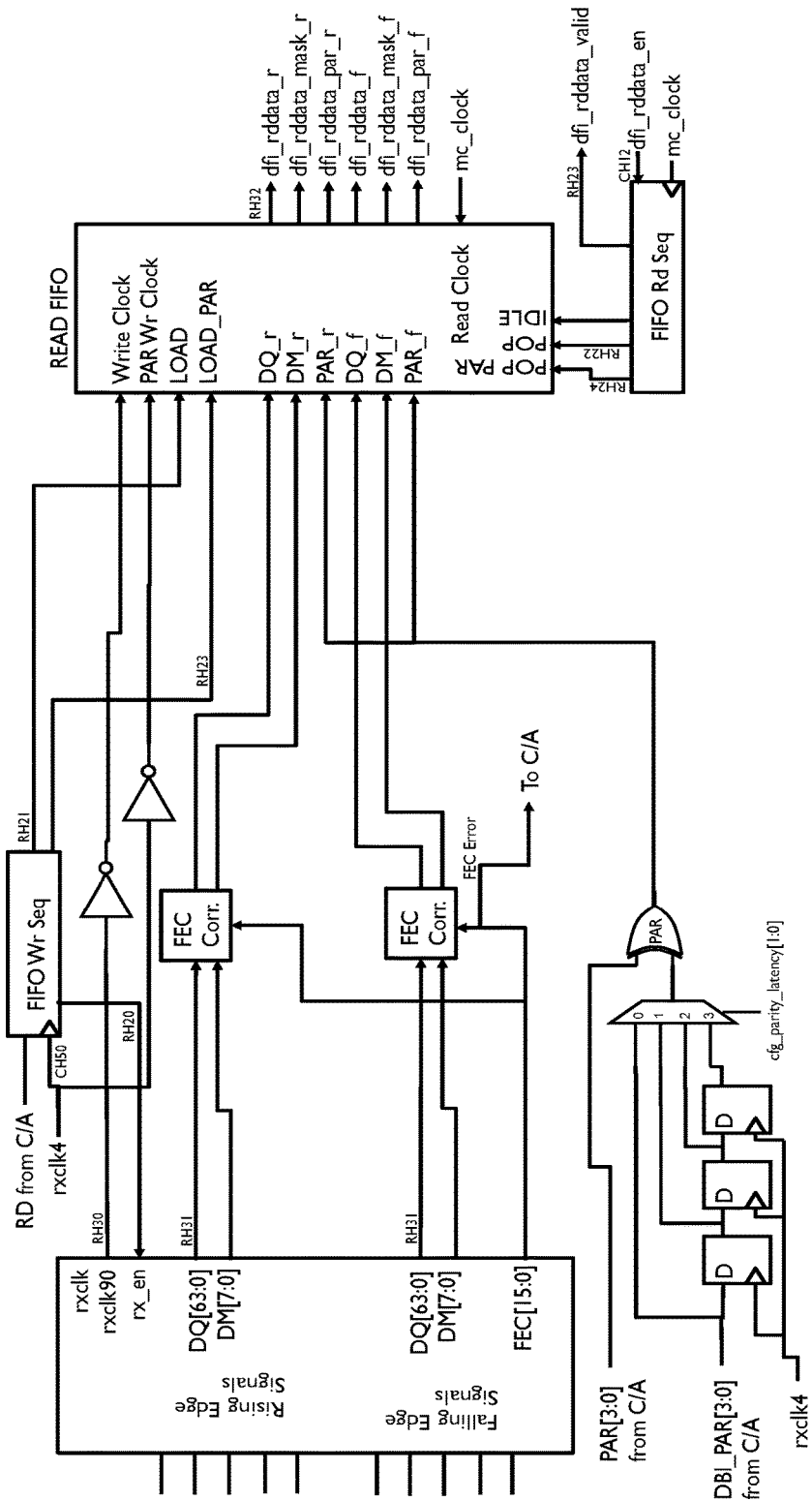
FIG. 23 is a block diagram of one embodiment of the HEI Read data pipeline.

FIG. 23 is a block diagram of one embodiment of the HEI Read data pipeline. This example shows one pseudo-channel using two SERDES. HEI does not regenerate DBI to MC on read data, thus any DBI inputs to the MC should be tied to '0'. RD input to FIFO WR Seq is carried on C/A. Retimer latches are needed on fifo_load to avoid clock hazards. FEC errors are reported on C/A CST.

Figure 24:
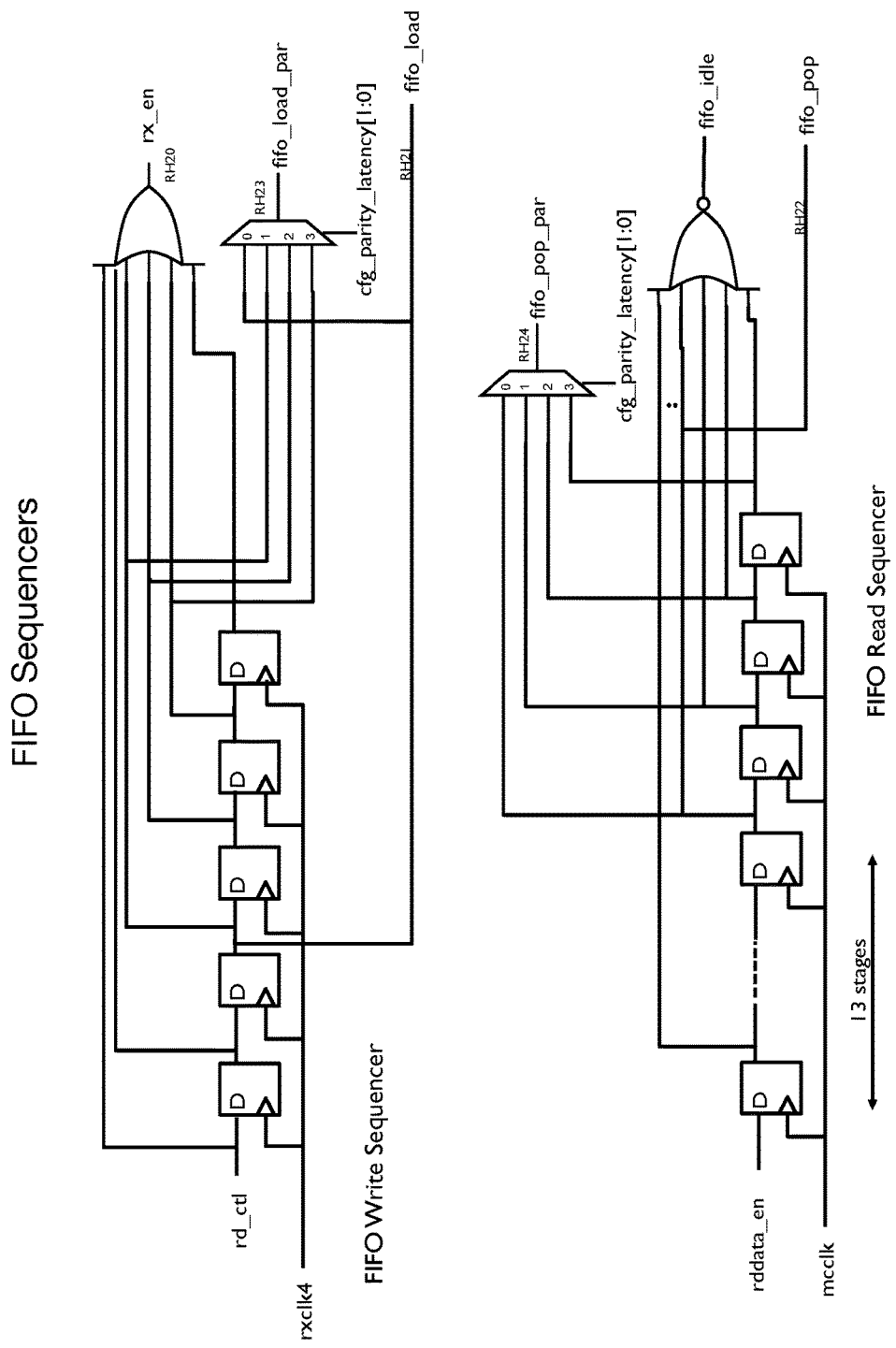
FIG. 24 is a block diagram of one embodiment of FIFO Sequencers.

FIG. 24 is a block diagram of one embodiment of FIFO Sequencers.

Figure 25:
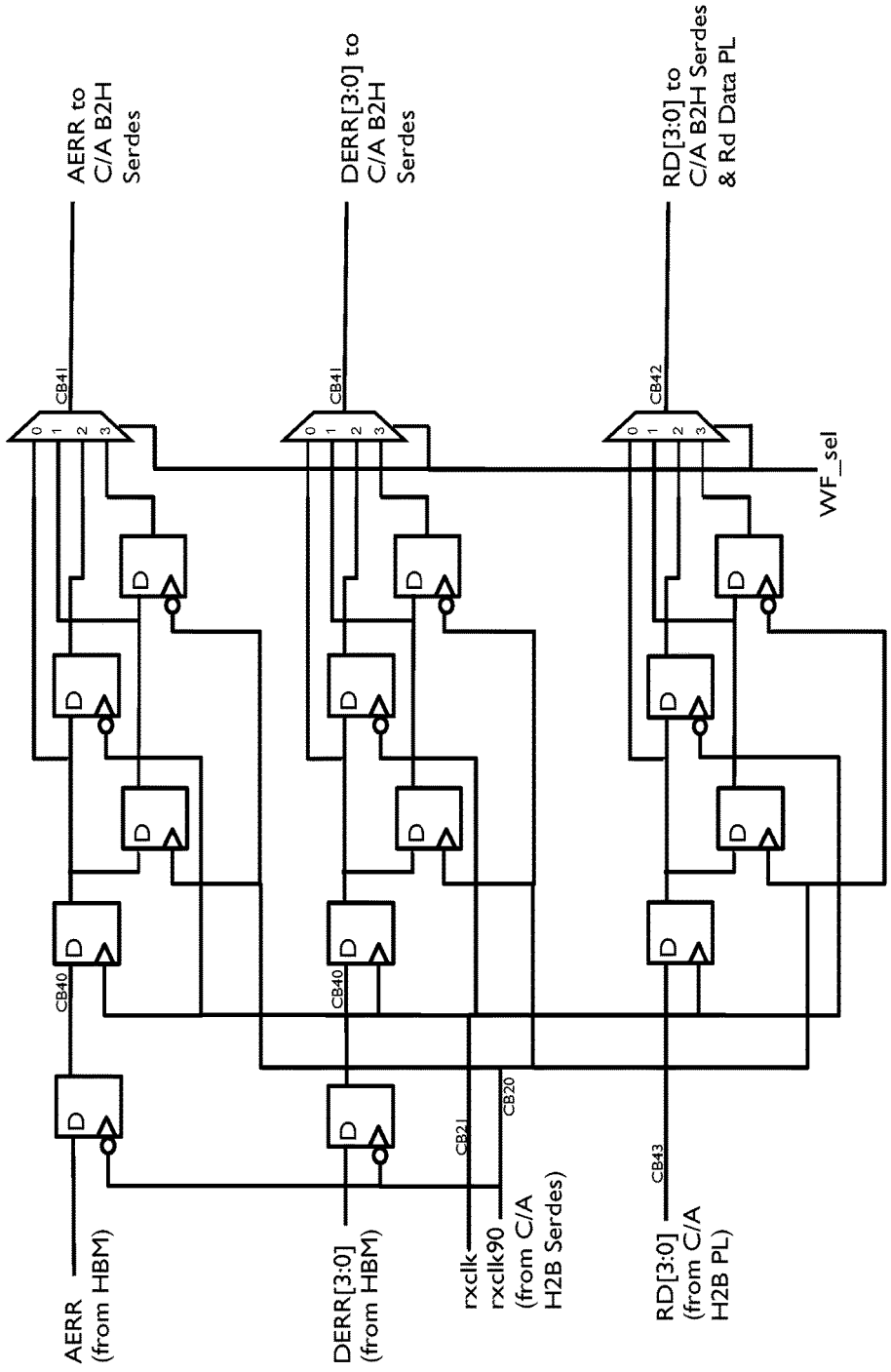
FIG. 25 is a block diagram of one embodiment of BEI Command/Address Waterfall retimers.

FIG. 25 is a block diagram of one embodiment of BEI Command/Address Waterfall retimers.

Alternative Embodiments

As mentioned in association with FIG. 1, for every embodiment herein the elements of FIG. 3 may be duplicated in reverse order at the other end of the EHBM transport, to convert each channel back to HBM again.

As illustrated by the third embodiment example described above, the total number of wires may be reduced by sharing clock signals across more than a single CNRZ-5 instance, at the cost of more complex on-chip clock distribution and larger amounts of skew across CNRZ-5 instances.

Additional Enhancements

The expanded EHBM control/status word permits introduction of additional signaling information beyond that permitted in HBM. As a first example, the field marked "extended address" may be used by a native EHBM controller to pass addressing information that a compatible EHBM switching device may use to select among HBM memory stacks, enabling deeper memories than permitted by HBM alone.

Future system architectures may also expand beyond the current "smart controller, dumb memory" model; as one example a "smart" EHBM switch may need to transfer information over a channel that is not being clock-driven by the host. Thus, at least one embodiment of an EHBM interface supports an alternate mode of operation, in which a local system clock within the smart EHBM switch is used as the transmit clock for CNRZ-5 channels in the memory-to-host direction if and when the corresponding host-to-memory clock is idle. It is also possible to imagine other embodiments of smart switches utilizing the otherwise idle return-channel capacity of a full duplex EHBM channel, as examples to return read data results from a previous read operation overlapped with write data for a new write operation, or to pipeline future read requests with current read responses. With sufficiently efficient scheduling, these "true full duplex" transfers could potentially double the delivered data transfer rate per channel in certain usage scenarios.

The invention claimed is:
1. A method comprising:
receiving a set of bits and an associated clock signal in parallel over a first multi-wire bus, the plurality of bits comprising data bits and control bits;
generating an augmented set of bits by augmenting the received set of bits with at least forward error correction (FEC) bits, the augmented set of bits comprising 5×n×m bits, wherein n and m are integers greater than or equal to 1;
generating a selector signal and at least one high-rate clock signal from the received associated clock signal, the selector signal and high-rate clock signal having a rate n times higher than the received clock signal;

generating n sets of m codewords, each set of m codewords generated in a respective transmission interval of n consecutive transmission intervals, wherein generating a given set of m codewords comprises:

selecting m sets of 5 bits from the augmented set of bits according to the selector signal; and generating the given set of m codewords, each codeword generated based on a transformation of a respective set of 5 bits of the selected m sets of 5 bits with a non-simple orthogonal matrix; and transmitting the n sets of m codewords according to the at least one high-rate clock signal over a second multi-wire bus, each of the sets of m codewords transmitted in a corresponding transmission interval, wherein the second multi-wire bus have a fewer number of wires than the first multi-wire bus.

2. The method of claim 1, wherein each codeword comprises 6 symbols.

3. The method of claim 2, wherein each symbol has a symbol value selected from a quaternary alphabet.

4. The method of claim 3, wherein the quaternary alphabet comprises symbol values selected from the set [$\pm 1$, $\pm \frac{1}{3}$].

5. The method of claim 1, wherein n=8 sets of m=5 codewords are sent over n=8 transmission intervals.

6. The method of claim 1, wherein n=5 sets of m=8 codewords are sent over n=5 transmission intervals.

7. The method of claim 1, wherein the at least one high-rate clock signal comprises a single high-rate clock signal, and wherein each set of m codewords is transmitted according to the single high-rate clock signal.

8. The method of claim 1, wherein the at least one high-rate clock signal comprises m high-rate clock signals, and wherein each codeword of the given set of m codewords is transmitted according to a corresponding high-rate clock signal of the m high-rate clock signals.

9. The method of claim 1, wherein a subset of the n sets of m codewords are transmitted on unidirectional wires.

10. The method of claim 1, wherein a subset of the n sets of m codewords are transmitted on bidirectional wires.

11. An apparatus comprising:

a buffer configured to receive a set of bits in parallel over a first multi-wire bus, the plurality of bits comprising data bits and control bits;

a phase-locked loop configured to receive a clock signal associated with the received set of bits and to generate a selector signal and at least one high-rate clock signal from the received associated clock signal, the selector signal and high-rate clock signal having a rate nX higher than the received associated clock signal, wherein n is an integer greater than or equal to 1;

an augmentation circuit configured to receive the set of bits and to generate an augmented set of bits by augmenting the received set of bits with at least forward error correction (FEC) bits, the augmented set of bits comprising 5×n×m bits, wherein m is an integer greater than or equal to 1;

a selection circuit configured to receive the augmented set of bits, and to select m sets of 5 bits from the augmented set of bits according to the selector signal;

m encoders configured to generate n sets of m codewords, each set of m codewords generated in a respective transmission interval of n consecutive transmission intervals, wherein for a given set of m codewords, the encoder is configured to:

receive the selected m sets of 5 bits from the selection circuit; and generate the given set of m codewords, each codeword generated based on a transformation of a respective set of 5 bits of the selected m sets of 5 bits with a non-simple orthogonal matrix; and a plurality of drivers configured to transmit the n sets of m codewords according to the at least one high-rate clock signal over a second multi-wire bus, each of the sets of m codewords transmitted in a corresponding transmission interval, wherein the second multi-wire bus has a fewer number of wires than the first multi-wire bus.

12. The apparatus of claim 11, wherein each codeword comprises 6 symbols.

13. The apparatus of claim 12, wherein each symbol has a symbol value selected from a quaternary alphabet.

14. The apparatus of claim 13, wherein the quaternary alphabet comprises symbol values selected from the set [$\pm 1$, $\pm \frac{1}{3}$].

15. The apparatus of claim 11, wherein n=8 sets of m=5 codewords are sent over n=8 transmission intervals.

16. The apparatus of claim 11, wherein n=5 sets of m=8 codewords are sent over n=5 transmission intervals.

17. The apparatus of claim 11, wherein the at least one high-rate clock signal comprises a single high-rate clock signal, and wherein the plurality of drivers is configured to transmit each set of m codewords according to the single high-rate clock signal.

18. The apparatus of claim 11, wherein the at least one high-rate clock signal comprises m high-rate clock signals, and wherein the plurality of drivers is configured to transmit each codeword of a given set of m codewords according to a corresponding high-rate clock signal of the m high-rate clock signals.

19. The apparatus of claim 11, wherein a subset of the n sets of m codewords are received on unidirectional wires.

20. The apparatus of claim 11, wherein a subset of the n sets of m codewords are received on bidirectional wires.

* * * * *